United States Patent
Escudero Rodriguez et al.

(10) Patent No.: US 10,903,829 B2
(45) Date of Patent: Jan. 26, 2021

(54) SWITCHED CAPACITOR DRIVING CIRCUITS FOR POWER SEMICONDUCTORS

(71) Applicant: Infineon Technologies Austria AG, Villach (AT)

(72) Inventors: Manuel Escudero Rodriguez, Villach (AT); Matteo-Alessandro Kutschak, Ludmannsdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/444,384

(22) Filed: Jun. 18, 2019

(65) Prior Publication Data
US 2020/0403607 A1 Dec. 24, 2020

(51) Int. Cl.
*H03K 17/06* (2006.01)
*H02M 3/07* (2006.01)

(52) U.S. Cl.
CPC .......... *H03K 17/063* (2013.01); *H02M 3/073* (2013.01)

(58) Field of Classification Search
CPC ....... H03K 17/06; H03K 17/063; H02M 3/00; H02M 3/02; H02M 3/04; H02M 3/06; H02M 3/07; H02M 3/073; H02M 2003/075; H02M 2003/076; H02M 2003/077; H02M 2003/078
USPC .................................................. 327/108–112
See application file for complete search history.

(56) References Cited

U.S. PATENT DOCUMENTS

| 5,343,088 | A | * | 8/1994 | Jeon | G05F 3/205 |
| | | | | | 327/536 |
| 5,808,502 | A | | 9/1998 | Hui et al. | |
| 6,605,963 | B2 | * | 8/2003 | Kitamoto | H03K 3/356113 |
| | | | | | 326/62 |
| 7,782,098 | B2 | * | 8/2010 | Hashimoto | H02M 3/07 |
| | | | | | 327/108 |
| 2002/0021150 | A1 | | 2/2002 | Tuchiya et al. | |
| 2007/0177412 | A1 | | 8/2007 | Sharp | |
| 2013/0093503 | A1 | | 4/2013 | Kok et al. | |

(Continued)

FOREIGN PATENT DOCUMENTS

| JP | H06204406 A | 7/1994 |
| JP | 2006353007 A | 12/2006 |

(Continued)

*Primary Examiner* — Diana J. Cheng
(74) *Attorney, Agent, or Firm* — Murphy, Bilak & Homiller, PLLC

(57) ABSTRACT

Driver circuits are provided for driving a power switch. The driver circuits include one or more charge pumps configured to generate a boosted positive voltage and/or a decreased voltage to a gate of the power switch. The decreased voltage may provide a negative voltage to the gate of the power switch, relative to its source, when the power switch is transitioned to its off state. The boosted positive voltage provides a voltage that is higher than the voltage that would otherwise be provided by a driver power supply. The decreased voltage generated by a turn-off charge pump has the effect of transitioning the power switch to its off state more quickly. The boosted voltage generated by a turn-on charge pump has the effect of transitioning the power switch to its on state more quickly. The decreased transition times provided by the driver circuits reduce switching losses of the power switch.

18 Claims, 11 Drawing Sheets

(56) References Cited

U.S. PATENT DOCUMENTS

| | | |
|---|---|---|
| 2015/0263611 A1 | 9/2015 | Iwamizu |
| 2015/0270774 A1 | 9/2015 | Tamura et al. |
| 2016/0020693 A1 | 1/2016 | Ribarich |
| 2017/0005585 A1 | 1/2017 | Shimura et al. |
| 2018/0019666 A1 | 1/2018 | Zhang et al. |

FOREIGN PATENT DOCUMENTS

| | | |
|---|---|---|
| JP | 2013099181 A | 5/2013 |
| JP | 2014068326 A | 4/2014 |
| WO | 2012087320 A1 | 6/2012 |

\* cited by examiner

SWITCHED CAPACITOR DRIVING CIRCUITS FOR POWER SEMICONDUCTORS

TECHNICAL FIELD

The present application relates to driver circuits and related techniques for driving a power switch, wherein the driver circuits incorporate one or more switched capacitor charge pumps so as to reduce transition times for the power switch.

BACKGROUND

Many modern electronic circuits, such as switching voltage converters and motor drivers, make use of power switches to control the flow of high current levels. The power efficiency of such electronic circuits is typically determined largely by the efficiency of the power switches within these circuits. So as to minimize the power losses of such switches, they are preferably operated in either a fully on state or a fully off state. In the fully on state, the voltage across load terminals, e.g., a drain and source, of a power switch is near zero, such that nearly no power is consumed by the power switch. In the fully off state, no current flows through the power switch and, thus, no power is consumed. As the power switch transitions between its fully on and fully off states, however, the voltage and current may be nonzero, thereby leading to power consumption (loss) within the power switch.

Many electronic circuits, including, e.g., resonant voltage converters, seek to drive the power switch voltage and/or current to zero just prior to each transition of the power switch. Such soft-switching typically requires the use of capacitors and/or inductors within the electronic circuit, and these components must be carefully tuned to achieve zero-voltage or zero-current switching. Many circuits may not be able to accommodate the component size and/or the reactance that are required for soft switching. Such circuits must often rely upon hard switching of power switches.

The power loss associated with hard switching of a power switch is largely determined by the time required to transition the power switch from its on to its off state and from its off to its on state. For a metal-oxide semiconductor field-effect transistor (MOSFET) or similar power switch, these transition times are determined by the time required for charging or discharging the gate capacitance of the power switch. A driver circuit for such a power switch typically inputs a digital control signal, and sources or sinks current to the gate of the power switch so as to turn the power switch on and off. A common driver circuit includes a source, or turn-on, transistor, which switchably couples a driving voltage to the power switch gate, and a sink, or turn-off, transistor, which switchably couples the gate to the source of the power switch. The transition times for the power switch are typically determined by the size (current support) of the source and sink transistors, the driving voltage, and external components, such as a resistor, between the switch driver and the power switch. High driving voltages may not be available/feasible in some circuits and, in any case, do not affect the turn-off transition speed. The source and sink transistors consume power themselves and their size cannot be increased without limit.

Driving circuit topologies are desired that reduce switch transition times for power switches while not requiring larger driver transistors or higher driving voltages.

SUMMARY

According to an embodiment of a driver circuit for driving a power switch, the driver circuit comprises a first switch device, a second switch device, and a first switched capacitor charge pump. The first and second switch devices are coupled in series and connected at an output node of the driver circuit. The first switch device is configured to couple the output node to a high-voltage node during an on phase of a switching cycle, so as to source current to the output node. The second switch device is configured to couple the output node to a low-voltage node during an off-phase of the switching cycle, so as to sink current from the output node. The first switched capacitor charge pump is configured to apply a negative voltage to the low-voltage node during at least part of the off-phase of the switching cycle.

According to another embodiment of a driver circuit for driving a power switch, the driver circuit comprises a first switch device, a second switch device, and a switched capacitor charge pump. The first and second switch devices are coupled in series and connected at an output node of the driver circuit. The first switch device is configured to couple the output node to a high-voltage node during an on-phase of a switching cycle, so as to source current to the output node. The second switch device is configured to couple the output node to a low-voltage node during an off-phase of the switching cycle, so as to sink current from the output node. The switched capacitor charge pump is configured to apply a boosted voltage to the high-voltage node during at least part of the on phase of the switching cycle. The boosted voltage is higher than a positive voltage rail that is provided to the switched capacitor charge pump by a driver power supply.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

FIGS. 5A and 5B illustrate waveforms showing voltages, currents, and switch losses as a power switch is turned on.

DETAILED DESCRIPTION

Figure 1:
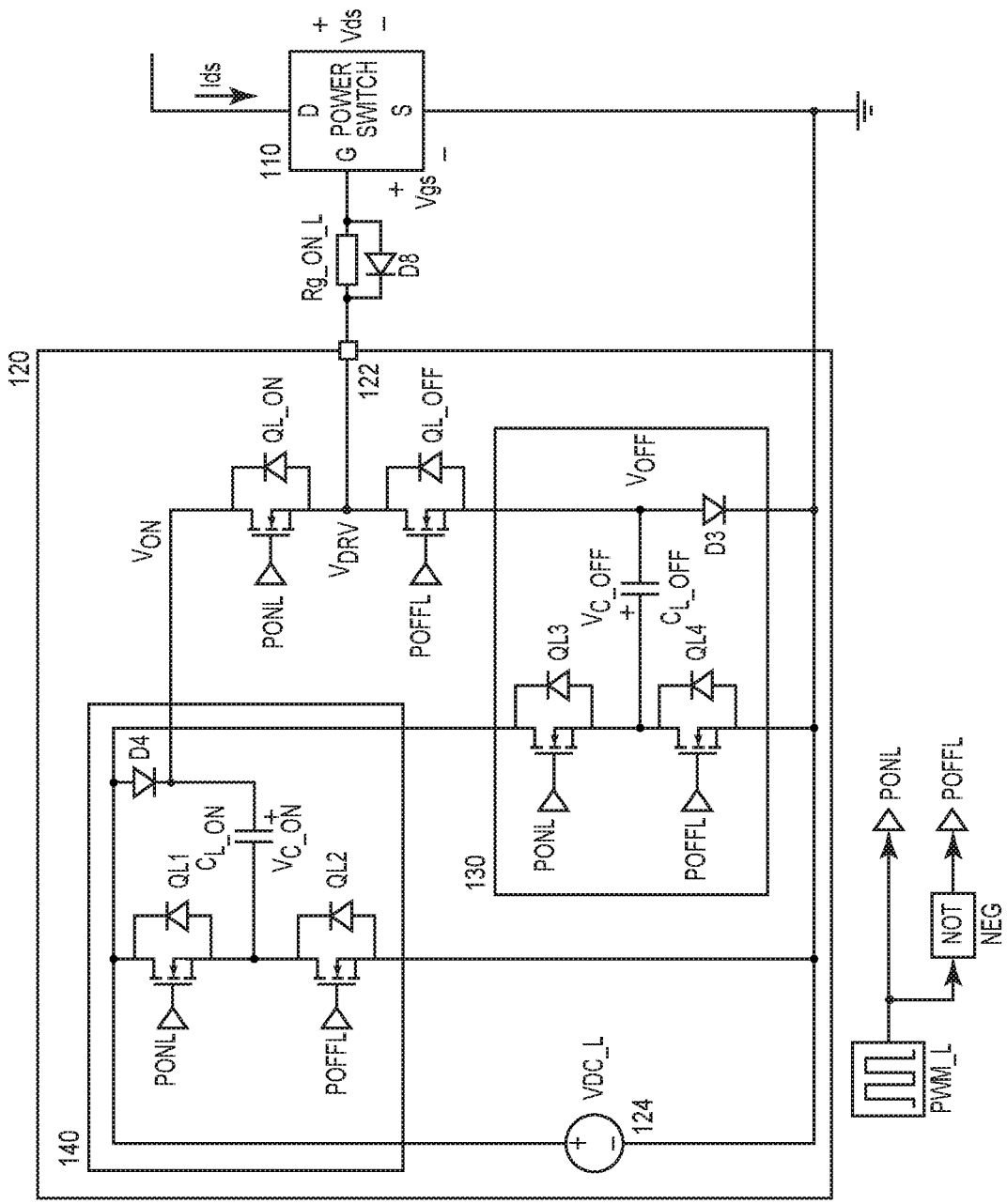
FIG. 1 illustrates a schematic diagram of a driver circuit configured to control a power switch, wherein the driver circuit includes charge pumps to aid in turning the power switch on and off.

The embodiments described herein provide driver circuits that include one or more switched capacitor charge pumps. Such driver circuits may be used to drive a power switch via an output node of the driver circuit. While the driver circuits are described in the context of driving an n-channel power metal-oxide semiconductor field-effect transistor (MOSFET), it should be understood that the driver circuits may be similarly used to drive other power switches including, e.g., p-channel MOSFETs, insulated gate bipolar transistors (IGBTs), and High Electron Mobility Transistors (HEMTs).

In one embodiment, a totem-pole switch driver is augmented with a turn-off switched capacitor charge pump arranged to aid in turning off the power switch. The totem-pole switch driver includes a "turn-on" switch device configured to source current from a driver power supply, which provides a positive voltage rail, to the output node. The sourced current, in turn, charges the gate, or a similar control terminal, of the power switch, thereby turning the power switch on. The totem-pole switch driver also includes a "turn-off" switch device configured to sink current, so as to discharge the gate, or similar control terminal, of the power switch, thereby turning the power switch off. The turn-off charge pump provides a low voltage to the source of the turn-off driver switch device at the turn-off transition. The provided voltage is lower than a reference voltage, e.g., ground and/or the voltage at the source of the power switch, that would otherwise be provided to the source of the turn-off driver switch device. This low (negative) voltage provided by the turn-off charge pump facilitates a fast discharge of the gate of the power switch, thereby leading to a reduced turn-off transition interval of the power switch and reduced power loss during this transition.

In another embodiment, a totem-pole switch driver is augmented with a turn-on switched capacitor charge pump. The totem-pole switch driver is configured, as described above, with a "turn-on" and a "turn-off" switch device for, respectively, sourcing current to and sinking current from the output node. The turn-on charge pump provides a high voltage to the drain of the turn-on switch device of the totem pole. The provided voltage is higher than the voltage of the positive voltage rail, which would be provided to the drain without the turn-on charge pump. The high voltage provided by the turn-on charge pump facilitates a fast charging of the gate of the power switch, thereby leading to a reduced turn-on transition interval of the power switch and reduced power loss during this transition. The turn-on charge pump boosts the voltage supplied to the totem pole switch driver, without requiring an increased voltage from the driver power supply.

Yet another embodiment combines the turn-on charge pump and the turn-off charge pump with a totem pole switch driver, so as to reduce both the turn-on and turn-off transition intervals, and reduce power loss during both transitions. The circuit descriptions below focus on such a combined embodiment.

The turn-off charge pump may be configured such that the low voltage provided by the turn-off charge pump at the turn-off transition is maintained at a negative level throughout an off phase of the power switch, or such that the low (negative) voltage is applied at the turn-off transition but subsequently rises to the reference voltage, e.g., 0V, before the end of the turn-off phase. The turn-on charge pump may analogously be configured such that the high voltage provided by the turn-on charge pump is maintained throughout an on phase of the power switch, or such that the high voltage is applied at the turn-on transition but subsequently decreases towards the voltage of the positive voltage rail. Such configurations, and their respective advantages, are described in further detail below.

For clarity of description, the switch devices of the totem-pole output stage and of the charge pumps are described below as n-channel MOSFETs, but it should be appreciated that other switch types may be preferred in some applications. For example, p-channel MOSFETs, bipolar junction transistors (BJTs), etc. may be used. Furthermore, the switch devices of a driver circuit may be of different transistor types. For example, the totem-pole may be comprised of complementary MOSFETs, wherein the sourcing (turn-on) switch device is a p-channel MOSFET, and the sinking (turn-off) switch device is an n-channel MOSFET, such that a common control signal may drive both devices. Alternatively, the totem-pole may be comprised of complementary PNP and NPN BJTs. In the same manner, the charge pump circuits may also be comprised of complementary MOSFETs or BJTs.

The above embodiments may additionally be augmented by a biasing circuit for mitigating unwanted voltage variation (e.g., noise, ringing), thereby stabilizing the voltage driven from the driver circuits. The driver circuits may be used to drive individual power switches, may use bootstrapping to drive a high-side power switch within a half bridge, and for other power switch topologies. The components of the driver circuits may be monolithically integrated on a single die, or may be spread across multiple dies.

Driver Circuit with Charge Pumps to Aid Turn on and Turn Off of a Power Switch

FIG. 1 illustrates a power switch 110 and a driver circuit 120 according to an embodiment of the invention. The power switch 110 is illustrated as a MOSFET having a gate, a drain and a source but, as described earlier, the switch driver 120 may be used to drive other types of power switches. As illustrated, an external resistor Rg_ON_L connects an output 122 of the driver circuit 120 to the gate (G) of the power switch 110, and may be used to limit the turn-on speed of the power switch 110, such that the voltage change (dV/dt) across and/or the current change (dI/dt) through the power switch 110 remain within acceptable ranges. A diode D8 coupled between the gate (G) and switch driver 120 serves to bypass the resistor Rg_ON_L when the switch driver 120 is discharging the gate (G) so as to turn off the power switch 110. For the turn-off transition, the dV/dt and/or dI/dt are typically limited by resonant elements of the power commutation loop, and it is not necessary to limit the turn-off speed by reducing the discharge drive current with an external resistor. In contrast to this, it is typically desirable to provide a very low impedance path from the gate (G), such that the gate may be discharged as quickly as possible.

The driver circuit 120 includes a driver power supply 124 that provides a positive voltage rail VDC_L, a turn-on driver switch QL_ON, and a turn-off driver switch QL_OFF. The turn-on driver switch QL_ON switchably couples a positive voltage $V_{ON}$ to the driver output 122, so as to turn on the power switch 110 by supplying current to, and thereby charging, the power switch gate (G). (This voltage is positive relative to the source of the power switch 110.) The turn-off driver switch QL_OFF couples a low voltage $V_{OFF}$ to the driver output 122, so as to turn off the power switch 110 by sinking current from, and thereby discharging, the power switch gate (G). The driver circuit 120 additionally includes a turn-off charge pump 130, which aids in the turn off of the power switch 110, and a turn-on charge pump 140, which aids in the turn on of the power switch 110.

The speed with which the power switch 110 transitions from its on to its off state is determined by how quickly its gate (G) is discharged. The magnitude of the current sunk at this transition, and the resultant speed of the gate discharge, is dependent, in part, upon the low voltage that is coupled to the output 122 by the turn-off switch QL_OFF. In a conventional driver circuit, this low voltage would be the same as the voltage of the source of the power switch 110, i.e., $V_{GS}$ of the power switch 110 would be driven towards 0V. In contrast to this, the turn-off charge pump 130 provides a voltage $V_{OFF}$ that is lower than the source voltage of the power switch 110, at least at the transition from the on to the off state. This results in a negative voltage being driven to the output 122. This is explained further in conjunction with the power loops of FIGS. 2A, 2B and 2C, and the voltage and current waveforms of FIGS. 3A and 3B.

The speed with which the power switch 110 transitions from its off to its on state is determined by how quickly its gate (G) is charged. The magnitude of the current sourced at this transition, and the resultant speed of the gate charging, is dependent, in part, upon the positive voltage that is coupled to the output 122 by the turn-on switch QL_ON. In a conventional driver circuit, this high voltage would be the same as the positive voltage rail VDC_L, i.e., the output 122 would be driven by the voltage VDC_L. In contrast to this, the turn-on charge pump 140 provides a voltage $V_{ON}$ that is higher than the positive voltage rail VDC_L. This results in a higher (boosted) positive voltage being driven to the output 122, i.e., $V_{DRV}$>VDC_L, at least just after an off-to-on state transition. This is explained further in conjunction with the power loops of FIGS. 2A, 2B, and 2D, and the voltage and current waveforms of FIGS. 5A and 5B.

While the driver circuit 120 of FIG. 1 includes both the turn-on charge pump 140 and the turn-off charge pump 130, alternative embodiments may include only one of these charge pumps. For example, an alternative driver circuit may delete the turn-on charge pump 140, in which case the positive voltage rail VDC_L is coupled directly to the turn-on driver switch QL_ON, and $V_{ON}$=VDC_L. Such an alternative driver circuit would still yield the advantages of the turn-off charge pump 130. In typical implementations, the turn-off charge pump 130 provides more benefit than the turn-on charge pump 140. More particularly, the power supply 124 may provide a positive voltage rail VDC_L that is significantly higher than a turn-on threshold $V_{th}$ of the power switch 110, in which case the higher voltage $V_{ON}$ provided by the turn-on charge pump 140 may not provide as significant of a benefit as the turn-off charge pump, at least when driving a standard silicon-based power MOSFET. Other power switch types, e.g., silicon-carbide (SiC) power MOSFETs, however, may benefit significantly from the boosted turn-on voltage provided by a turn-on charge pump, without requiring a higher voltage rail from a driver power supply. For example, the turn-on charge pump may make it feasible to drive a SiC-based MOSFET using a driver power supply, and its associated positive voltage rail, that is designed/optimized for driving silicon-based MOSFETs.

The power switch 110 of FIG. 1 may be a low-side power switch within a half bridge circuit, e.g., as used to drive a transformer or a buck converter. The switching of the power switch 110 is controlled by a low-side pulse-width-modulated control signal PWM_L, which is typically generated by a controller (not shown for ease of illustration). As shown in FIG. 1, the control signal PWM_L provides a direct drive signal PONL and an inverted (complementary) drive signal POFFL. The direct drive signal PONL controls the turn-on driver switch QL_ON, while the inverted drive signal POFFL controls the turn-off driver switch QL_OFF. These drive signals PONL, POFFL also control switches within the charge pumps 130, 140, as described in detail below.

Turn-Off Charge Pump

Figure 2A:
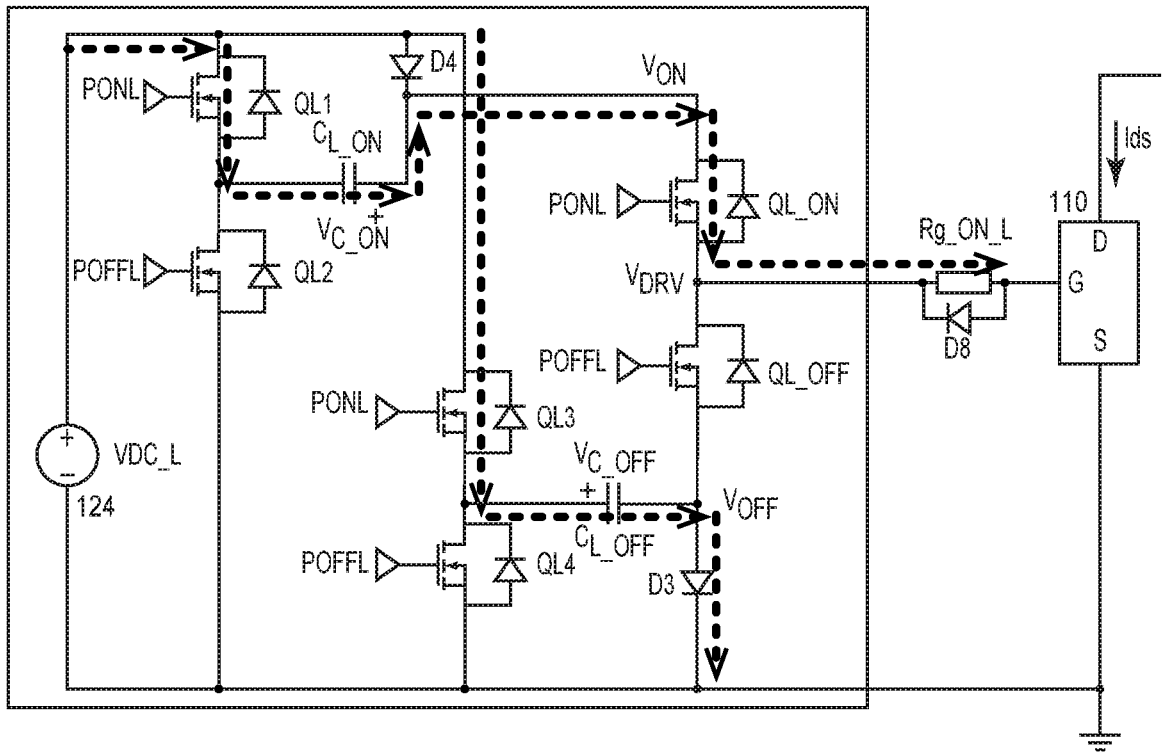
FIGS. 2A, 2B, 2C, and 2D illustrate power loops corresponding to different switch states for the driver circuit of FIG. 1.
Figure 2B:
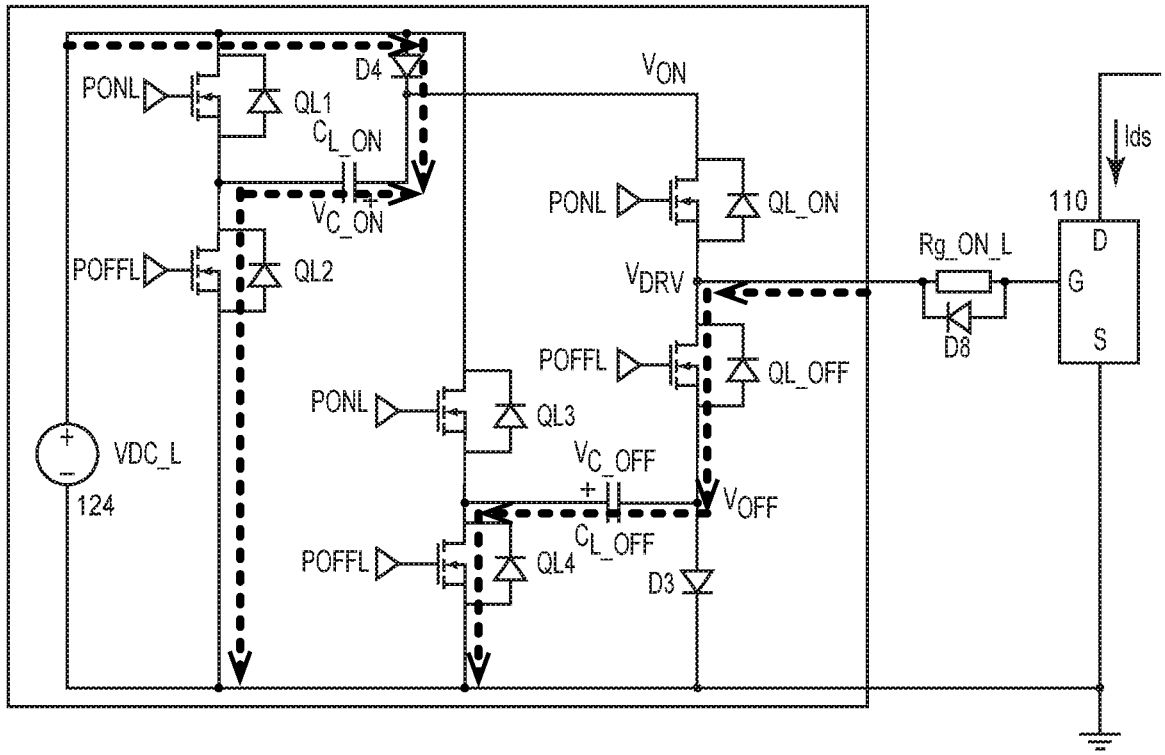
Figure 2C:
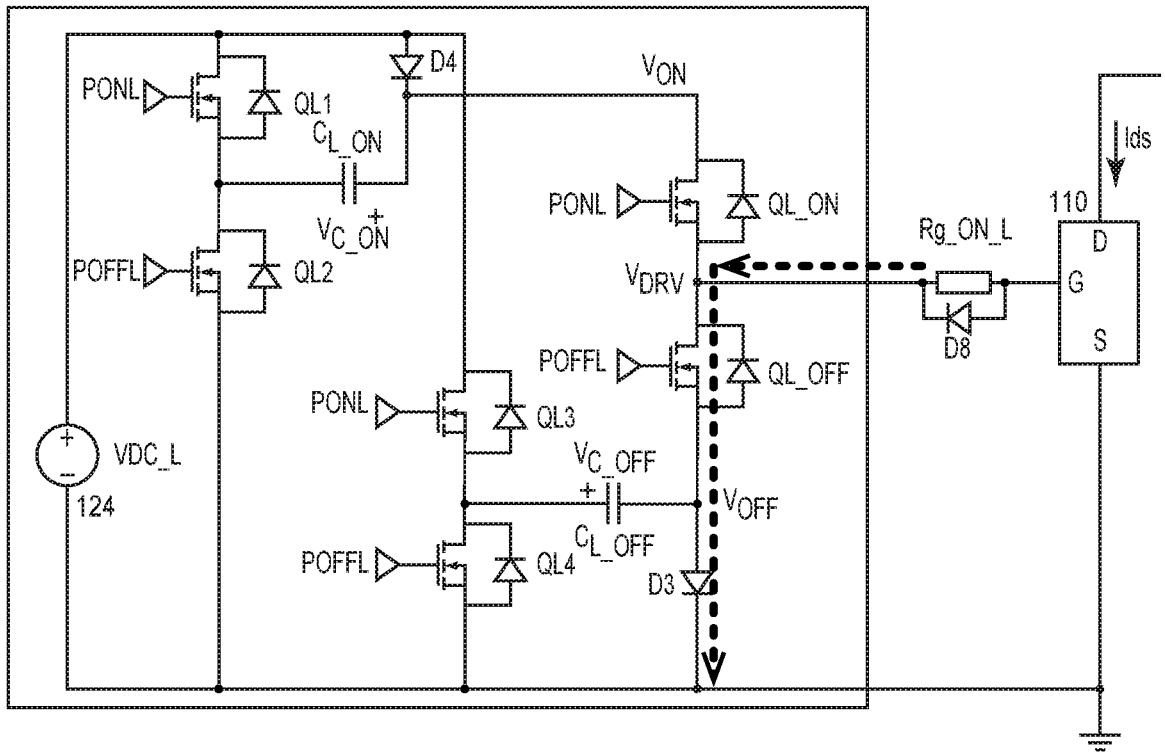

The turn-off charge pump 130 includes a capacitor-charging switch QL3, a grounding (reference-setting) switch QL4, a capacitor $C_{L\_OFF}$, and a diode D3. The switch QL3 is controlled by the direct drive signal PONL, such that the switch QL3 conducts simultaneously with the turn-on driver switch QL_ON. The switch QL4 is driven by the inverted drive signal POFFL, such that switch QL4 conducts simultaneously with the turn-off driver switch QL_OFF. FIGS. 2A, 2B, and 2C illustrate power loops (current flows) for different operational phases of the driver circuit 120, as they relate to the turn-off charge pump 130.

FIG. 2A illustrates power loops for an "ON" phase of the power switch 110, during which the direct drive signal PONL is active and the turn-on driver switch QL_ON couples a positive voltage to the gate (G) of the power switch 110. During this phase, the charging switch QL3 couples the positive voltage rail VDC_L to a positive terminal of the capacitor $C_{L\_OFF}$, and the diode D3 couples a negative terminal of the capacitor $C_{L\_OFF}$ to a reference voltage. The reference voltage is typically the voltage at the source of the power switch 110. For the case of a low-side power switch, as illustrated, this voltage is ground. For ease and clarity of explanation, this voltage will be referred to as ground in the following, but it should be understood that the reference voltage could be something other than ground in other circuits. At the end of the "ON" phase, the capacitor $C_{L\_OFF}$ is charged with a voltage $V_{C\_OFF}$=VDC_L-$V_F$, wherein VF is the forward voltage drop of the diode D3, e.g., 0.7V.

At the end of the "ON" phase, the inverted drive signal POFFL turns on the turn-off switch QL_OFF and the capacitor reference-setting switch QL4, whereas the capacitor-charging switch QL3 is turned off by the direct drive signal PONL. FIG. 2B shows the resultant power loop at the beginning of an "OFF" phase, wherein current flows to the driver circuit 120 from the gate (G) of the power switch 110 via the driver output 122. The switch QL4 couples the positive terminal of the capacitor $C_{L\_OFF}$ to the reference voltage (ground). The low voltage $V_{OFF}$ transitions to $-(V_{C\_OFF})$=$-(VDC\_L-V_F)$, which is lower than the voltage of the power switch source (S), thereby enabling a high level of sinking (discharging) current into the low potential.

If the charge transferred from the power switch gate (G) exceeds the negative charge stored on the capacitor $C_{L\_OFF}$, the low voltage $V_{OFF}$ may increase to a positive value. FIG. 2C illustrates a power loop corresponding to such a scenario, as may occur towards the end of an off phase. For this power loop, the low voltage $V_{OFF}$ has increased to the diode's forward (threshold) voltage $V_F$, such that the diode D3 conducts. The diode D3 clamps the low voltage $V_{OFF}$ such that it cannot exceed the forward diode voltage $V_F$. Because a diode threshold voltage $V_F$ is typically significantly lower than the threshold voltage $V_{TH}$ of a power switch, e.g., 0.7V vs. 5V, the forward voltage $V_F$ of the diode D3 should hold the power switch 110 in its nonconducting state for such a scenario. Further detail regarding the sizing of the capacitor $C_{L\_OFF}$ and its effect on the state transitions of the power switch 110 are described below in conjunction with equations (4)-(16), and FIGS. 4A and 4B.

Figure 3A:
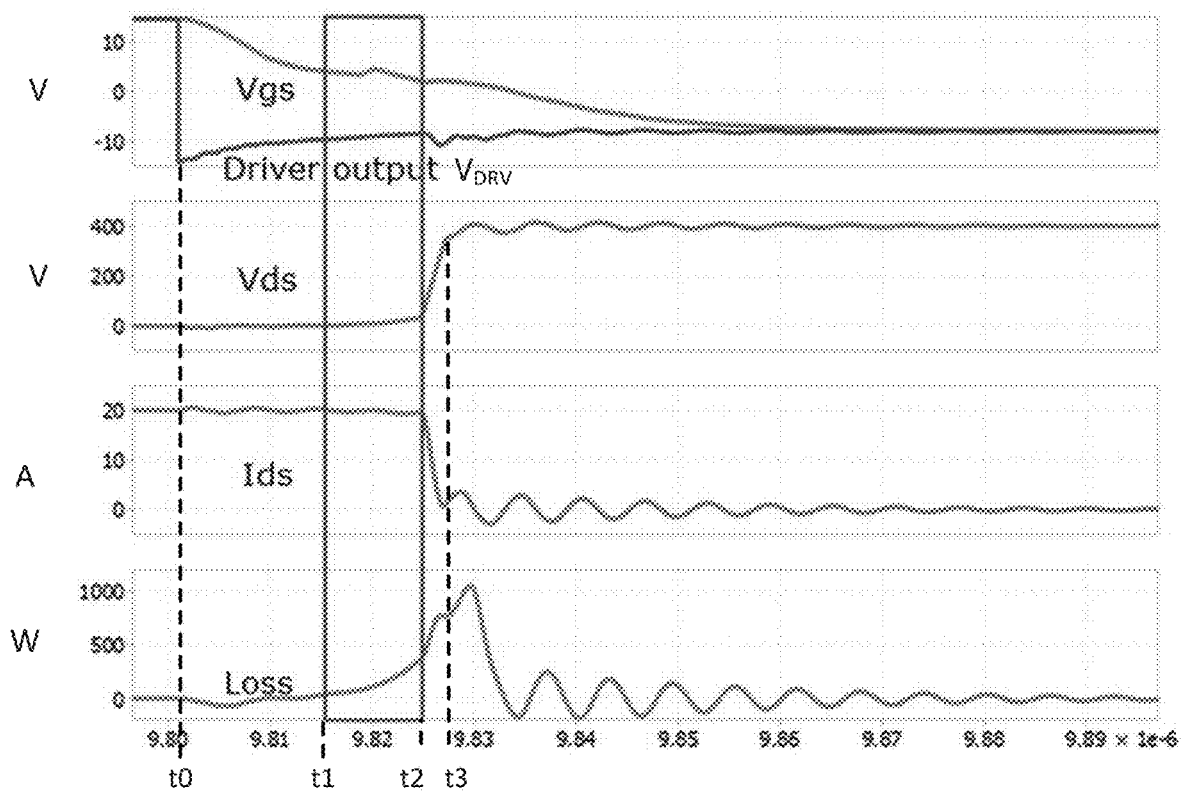
FIGS. 3A and 3B illustrate waveforms showing voltages, currents, and switch losses as a power switch is turned off.
Figure 3B:
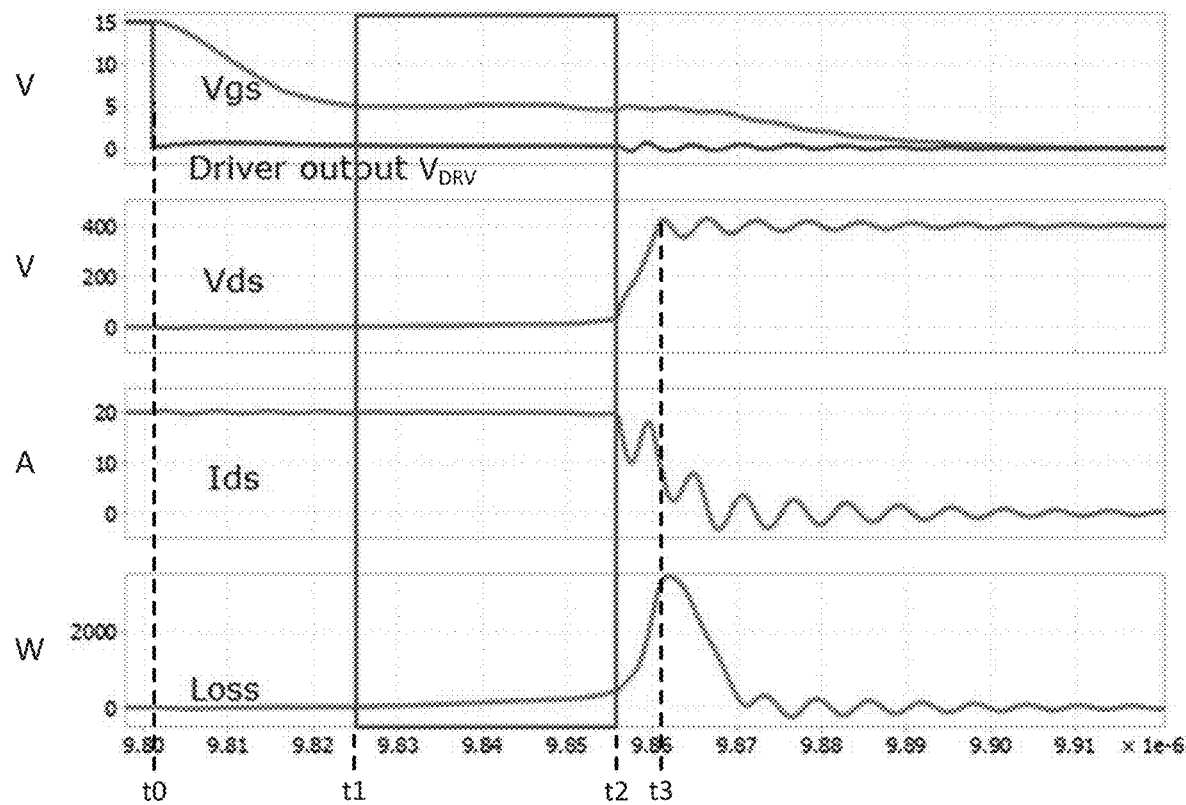

FIG. 3A illustrates waveforms corresponding to turn-off timing for a switch driver using a turn-off charge pump such as the turn-off charge pump 130 of FIG. 1, whereas FIG. 3B illustrates waveforms corresponding to turn-off timing when such a turn-off charge pump is not used. The waveforms of these figures show that the turn-off charge pump provides faster turn-off transitions and lower power loss in the power switch 110.

FIG. 3A illustrates waveforms corresponding to the driver output voltage $V_{DRV}$, the gate-to-source voltage Vgs of the power switch 110, the drain-to-source voltage Vds of the power switch 110, the current Ids of the power switch 110, and the Loss of the power switch 110. At time t0, the digital control signal PWM_L (not shown for ease of illustration) goes low, thereby turning on the turn-off driver switch QL_OFF. The charge-pump switch QL3 is turned off, and the charge-pump switch QL4 is turned on, such that the turn-off charge pump 130 drives a negative voltage onto the low-voltage node $V_{OFF}$. The driver output 122 thus drops from a voltage of VDC_L, e.g., 15V, to a voltage of $-(VDC\_L-V_F)$, e.g., -14.3V, at time t0. In conjunction with this, the gate-to-source voltage Vgs of the power switch 110 begins to decrease as current flows (charge transfers) from the power switch gate (G) to the driver output 122. This decrease continues, and the power switch 110 remains on, until time t1. For the interval just after time t1, the gate-to-source voltage Vgs stabilizes at the Miller voltage corresponding to the current Ids flowing through the power device 110. The current sunk by the driver 120 in this interval discharges the gate-to-drain capacitance of the power switch 110. At time t2, the gate-to-source voltage Vgs decreases to the threshold voltage $V_{TH}$ of the power switch 110. Between times t2 and t3, the drain-to-source voltage Vds increases and the current Ids decreases as the power switch 110 transitions off. The positive voltage Vds and current Ids during this transition lead to the illustrated Loss of the power switch 110, which reaches a peak of about 1000 W.

The waveforms of FIG. 3B are similar to those of FIG. 3A. However, the driver output only drops from the voltage VDC_L to 0V at time t0. Hence, the power switch gate (G) takes longer to discharge and the gate-to-source voltage Vgs takes longer to decrease. This is seen both in the longer interval between times t1 and t2, and between times t2 and t3. The drain-to-source voltage Vds increases and the current Ids decreases more slowly than in the waveforms of FIG. 3A. As a result of this, the waveforms of FIG. 3B show that the Loss of the power switch 110 is greater than for the circuit corresponding to FIG. 3A, which includes the turn-off charge pump. In particular, the power Loss shown in FIG. 3B peaks at just over 3000 W.

Capacitance Selection for the Turn-Off Charge Pump

The waveforms of FIG. 3A show that the driver output voltage $V_{DRV}$ and the gate-to-source voltage Vgs of the power switch 110 migrate towards an equilibrium voltage. For the illustrated case, this equilibrium voltage is higher than the negative voltage $-(VDC\_L-V_F)$ that is provided by the driver output at time t0, but is lower than 0V, i.e., the voltage of the source (S) of the power switch 110. For the illustrated scenario of FIG. 3A, the power loop of FIG. 2C, wherein the low voltage $V_{OFF}$ increases to a large enough value to forward bias the diode D3, does not occur.

The equilibrium voltage depends upon the capacitance of the capacitor $C_{L\_OFF}$ within the turn-off charge pump 130. A large capacitance leads to the scenario illustrated in FIG. 3A, wherein the equilibrium voltage is negative. A small capacitance leads to a scenario in which the capacitor $C_{L\_OFF}$ is completely discharged during the turn-off interval and the low voltage $V_{OFF}$ increases to a positive value such that the diode D3 becomes forward biased and the low voltage $V_{OFF}$ is clamped at the forward voltage $V_F$ of the diode D3. A moderate capacitance leads to a scenario in which the capacitor $C_{L\_OFF}$ is discharged, but the charge transferred from the gate-to-source capacitance is inadequate to provide a voltage above the forward bias voltage $V_F$ of the diode D3. For example, a moderate capacitance may yield an equilibrium voltage around 0V.

A relatively large capacitance of $C_{L\_OFF}$ and the corresponding negative value for the equilibrium voltage may be beneficial in some applications, as the negative voltage more robustly holds the power switch 110 in its off state. This may be needed for noisy circuits and/or for power switch types having low gate-to-source capacitances, which are more susceptible to unintentional turn on due to noise and/or ringing of the gate voltage. However, such a negative equilibrium voltage means that a larger gate-to-source voltage swing is required to turn the power switch 110 on at the next off-to-on transition. Hence, in other applications, a smaller capacitance $C_{L\_OFF}$ may be preferred, so as to provide a fast off-to-on transition and associated power loss advantages. The following describes the capacitance selection for such scenarios.

The power switch 110 has a gate-to-source capacitance as well as other external gate capacitances, which are considered herein to be a merged gate-to-source capacitance Cgs. With the charge-pump switch QL4 and the turn-off driver switch QL_OFF conducting, the gate-to-source capacitance Cgs and charge pump capacitance $C_{L\_OFF}$ are connected in parallel, such that the charge on them will balance until a voltage equilibrium is achieved, presuming the charge-pump diode D3 remains nonconductive during the turn-off phase. (The ohmic losses of the charge pump switches QL3, QL4 and the driver switches QL_ON, QL_OFF are typically negligible, and are not considered in the following explanations.)

At the end of the turn-on phase of the power switch 110, the gate-to-source capacitance Cgs has accumulated a charge of Cgs*VDC_L, presuming the positive turn-on voltage $V_{ON}$ is either coupled to the power supply 124 (e.g., if there is no turn-on charge pump 140), or that the voltage $V_{ON}$ provided by the turn-on charge pump 140 has settled to the voltage VDC_L of the positive rail by the end of the turn-on phase. The charge on the capacitance Cgs decreases to Cgs*$V_{EQ}$ at the end of the turn-off phase, once the low voltage $V_{OFF}$ and the gate voltage Vgs have settled to the equilibrium voltage $V_{EQ}$. Hence, the charge transferred from the gate-to-source capacitance Cgs during the turn-off phase is given by $Q_{GS\_DIS}$=Cgs(VDC_L-$V_{EQ}$).

At the end of the turn-on phase of the power switch 110, the charge-pump capacitor $C_{L\_OFF}$ builds up a charge $C_{L\_OFF}$*(VDC_L-$V_F$), where $V_F$ is the forward voltage of the diode D3. Once the power switch 110 is turned off and the charge-pump switch QL4 is turned on, thereby coupling the positive terminal of $C_{L\_OFF}$ to the reference voltage rail (ground), the negative terminal of the capacitor has a negative charge with magnitude $C_{L\_OFF}$*(VDC_L-$V_F$). The charge on the negative terminal of the capacitor $C_{L\_OFF}$ rises to $C_{L\_OFF}*V_{EQ}$ at the end of the turn-off phase, once the low voltage $V_{OFF}$ and the gate voltage Vgs have settled to the equilibrium voltage $V_{EQ}$. The charge transferred to the capacitor $C_{L\_OFF}$ during the turn-off phase is thus given by $Q_{COFF\_CHG}=C_{L\_OFF}*(VDC\_L-V_F)+C_{L\_OFF}*V_{EQ}$.

Provided that the diode D3 does not become forward biased (i.e., $V_{EQ}<V_F$), the charge transferred from the gate-to-source capacitance Cgs should be the same as the charge accumulated at the negative terminal of the turn-off capacitor $C_{L\_OFF}$, as given by:

$$Cgs*(VDC_L-V_{EQ})=C_{LOFF}*(VDC_L-Vf)+C_{LOFF}*V_{EQ}. \quad (1)$$

The equilibrium voltage $V_{EQ}$ can then be determined as follows:

$$V_{EQ} = \frac{-C_{L_{OFF}}*(VDC_L - Vf) + Cgs*VDC_L}{C_{L_{OFF}} + Cgs} \quad (2)$$

So as to maintain a negative gate-to-source voltage Vgs throughout the turn-off phase, the turn-off capacitor $C_{L\_OFF}$ must be large enough that it is not fully discharged as the voltages $V_{OFF}$ and Vgs equalize. The minimum capacitance to accomplish this is provided when the equilibrium voltage $V_{EQ}=0V$, which leads to:

$$Cgs*VDC_L = C_{L_{OFF}}*(VDC_L - Vf), \text{ and} \quad (3)$$

$$C_{L_{OFF}} = \frac{Cgs*VDC_L}{VDC_L - Vf}. \quad (4)$$

Given that the positive voltage rail VDC_L is typically significantly larger than the forward diode voltage $V_F$, e.g., 15V vs 0.7V, equation (4) shows that the capacitance $C_{L\_OFF}$ is quite similar in value to the gate-to-source capacitance, i.e., $C_{L_{OFF}} \approx Cgs$, for this scenario. A charge-pump capacitance $C_{L\_OFF}$ significantly larger than the gate-to-source capacitance Cgs leads to maintenance of a negative equilibrium voltage $V_{EQ}$ throughout the turn-off phase. A charge-pump capacitance $C_{L\_OFF}$ significantly smaller than the gate-to-source capacitance Cgs leads to full discharge of the charge pump capacitor $C_{L\_OFF}$ early during the turn off phase, and the driver output voltage $V_{DRV}$ is clamped at the diode forward voltage Vf. For moderate values of the charge pump capacitance $C_{L\_OFF}$, the capacitor may be discharged during the turn-off phase but the diode D3 is not forward biased. Capacitance derivations are provided below for cases wherein the capacitor $C_{L\_OFF}$ is discharged at the end of the Miller plateau during the turn-off transition, or at the end of the turn-off transition.

The gate-to-drain capacitance Cgd of the power switch 110 will provide additional charge to both the gate-to-source capacitance Cgs and the charge-pump capacitor $C_{L\_OFF}$ when the drain-to-source voltage Vds increases as the power switch 110 transitions to its off state. The gate-to-drain capacitance Cgd appears in series with the paralleled capacitances Cgs and $C_{L\_OFF}$, and, thus, the same amount of charge injected on the drain-to-source capacitance Cgd will be injected to the parallel equivalent capacitance Cgs+$C_{L\_OFF}$ as follows:

$$Cgd*(Vbus+VDC_L+V_{EQ})=\Delta V_{miller}*(C_{LOFF}+Cgs), \quad (5)$$

where Vbus is the high-voltage rail of the power switch 110, i.e., the voltage at the power switch drain (D) when the power switch 110 is turned off, and $\Delta V_{miller}$ is the voltage change of the gate-to-source voltage Vgs at the transition due to the Miller capacitance. (Prior to the turn-off transition, the gate-to-drain capacitance has a charge Cgd*Vgd=Cgd*Vgs=Cgd*VDC_L.) The equilibrium voltage $V_{EQ}$ is typically much smaller in magnitude than the voltage Vbus and, thus, may be neglected, leading to:

$$Cgd*(Vbus+VDC_L) = \Delta V_{miller}*(C_{L_{OFF}}+Cgs), \text{ and} \quad (6)$$

$$\Delta V_{miller} = \frac{Cgd*(Vbus+VDC_L)}{C_{L_{OFF}} + Cgs}. \quad (7)$$

The final gate-to-source voltage Vgs may thus be determined using equations (2) and (7):

$$Vgs = \Delta V_{miller} + V_{EQ} = \quad (8)$$

$$\frac{Cgd*(Vbus+VDC_L)}{C_{L_{OFF}}+Cgs} - \frac{C_{L_{OFF}}*(VDC_L-Vf)-Cgs*VDC_L}{C_{L_{OFF}}+Cgs}$$

As alluded to previously, the charge pump capacitance $C_{L\_OFF}$ may be selected to achieve different circuit behaviors. In a first scenario, the capacitance $C_{L\_OFF}$ is selected to be large enough that it is not fully discharged during the turn-off phase, which leads to having a negative voltage bias being driven onto the gate (G) of the power switch 110. This capacitance may be determined as follows:

$$V_{EQ} < 0 \text{ and } V_{EQ} < \Delta V_{miller}, \quad (9)$$

$$Vgs < 0, \text{ and} \quad (10)$$

$$C_{L_{OFF}} > \frac{Cgd*Vbus + Cgd*VDC_L + Cgs*VDC_L}{VDC_L - Vf}. \quad (11)$$

In a second scenario, the off-to-on transition of the power switch 110 is shortened by discharging the charge pump capacitor $C_{L\_OFF}$ by the end of the turn-off phase, such that the gate-to-source voltage Vgs=0 for the power switch 110 at the end of the transition. Hence, the voltage change for turning the power switch 110 back on is smaller and less charge is required at the turn-on transition. The capacitance for this scenario may be determined as follows:

$$Vgs = 0 = \Delta V_{miller} + V_{EQ}, \quad (12)$$

$$\frac{Cgd*(Vbus+VDC_L)}{C_{L_{OFF}}+Cgs} = \frac{C_{L_{OFF}}*(VDC_L-Vf)-Cgs*VDC_L}{C_{L_{OFF}}+Cgs}, \text{ and} \quad (13)$$

$$C_{L_{OFF}} = \frac{Cgd*Vbus+Cgd*VDC_L-Cgs*VDC_L}{(VDC_L-Vf)}. \quad (14)$$

In a third scenario, the dV/dt stage of the power switch 110 is sped up by determining a charge pump capacitance $C_{L\_OFF}$ such that this capacitor is fully discharged at the end of the Miller plateau. Such a capacitance is determined as follows:

$$V_{EQ} = \frac{C_{L_{OFF}} * (VDC_L - Vf) - Cgs * (VDC_L - Vplateau)}{C_{L_{OFF}} + Cgs} = \qquad (15)$$

$$\Delta V_{miller} = \frac{Cgd * (Vbus + VDC_L)}{C_{L_{OFF}} + Cgs},$$

$$C_{L_{OFF}} = \frac{Cgd * Vbus + Cgd * VDC_L + Cgs * VDC_L - Cgs * Vplateau}{(VDC_L - Vf)}. \qquad (16)$$

Figure 4A:
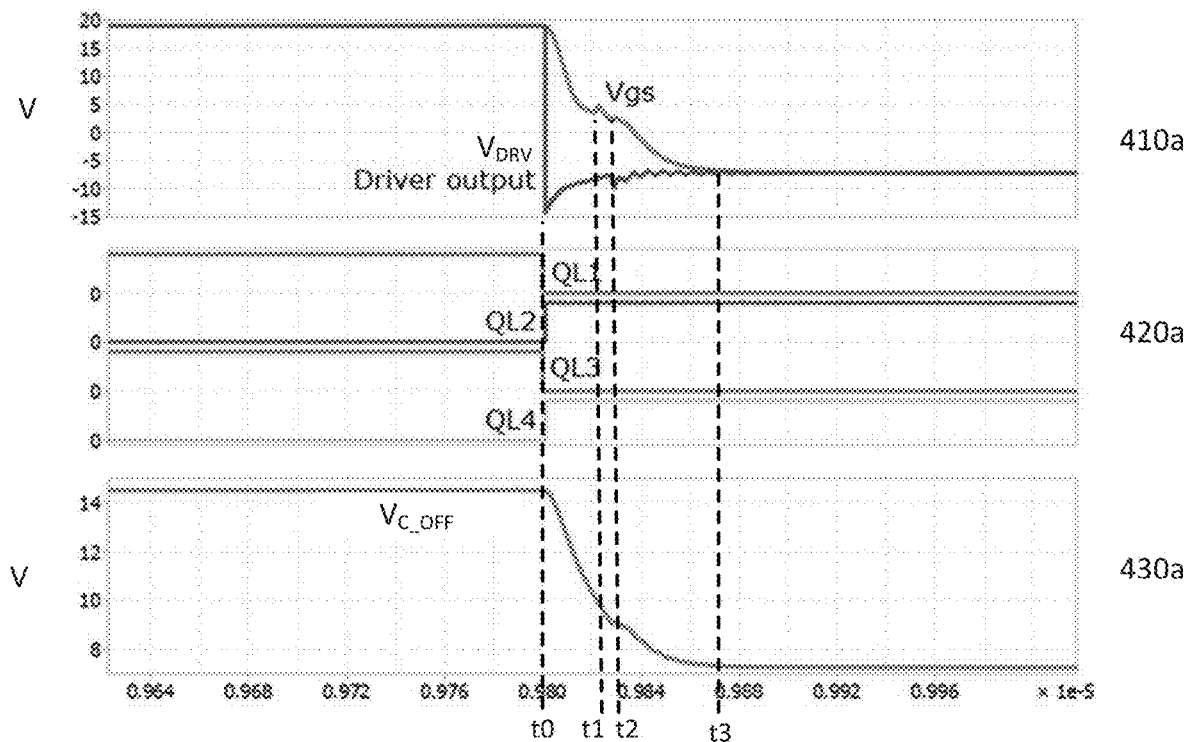
FIGS. 4A and 4B illustrate voltage waveforms corresponding to the driver circuit of FIG. 1 for different values of a turn-off charge pump capacitor within the driver circuit.
Figure 4B:
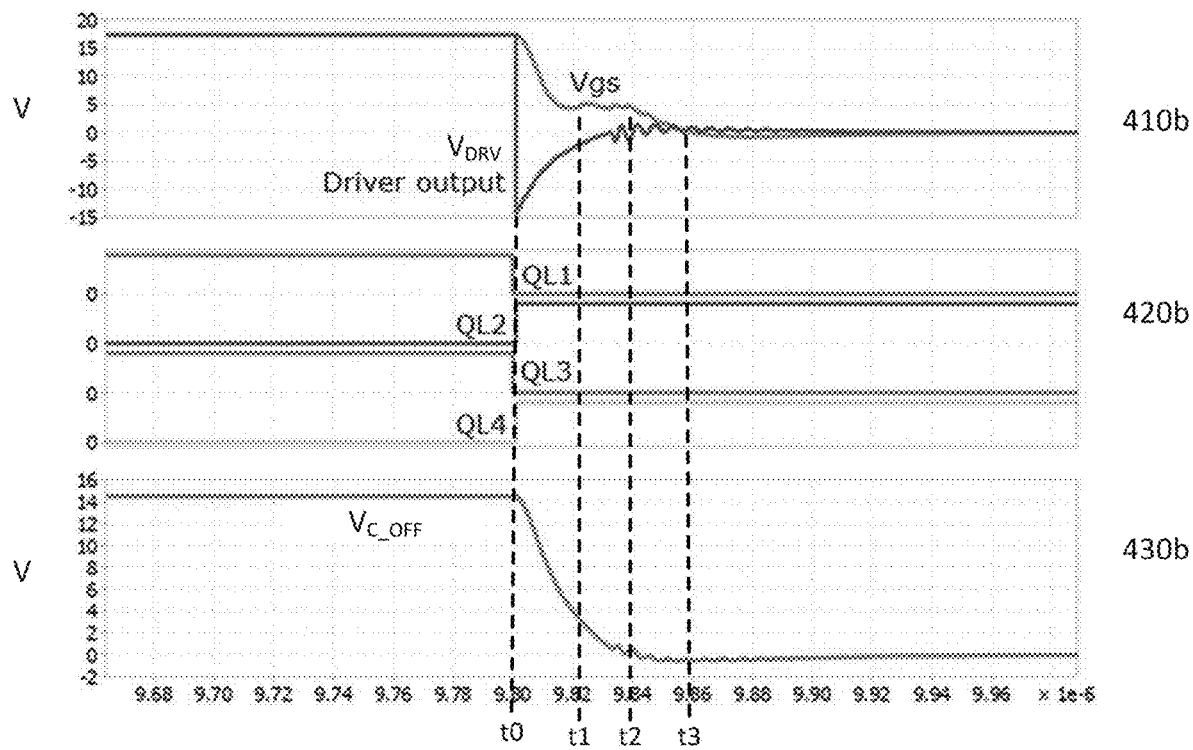

FIGS. 4A and 4B illustrate, respectively, waveforms corresponding to the first and third scenarios described above. As shown in FIG. 4A, at time t0, a control signal transitions so as to instigate a turn off of the power switch 110. This is shown in waveforms 420a, wherein the charge-pump switch QL3 is turned off and the charge-pump switch QL4 is turned on at time t0. The driver output transitions from a positive voltage rail to a low voltage that is approximately the negative of the positive voltage rail, e.g., $V_{OFF}$=VDC_L-$V_F$, as shown in the waveforms 410a. Between times t0 and t3, charge is transferred from the gate (G) of the power switch 110 to the charge-pump capacitor $C_{L\_OFF}$, such that the gate-to-source voltage Vgs and the driver output voltage converge to an equilibrium voltage $V_{EQ}$ of about −7.5V. The voltage $V_{C\_OFF}$ across charge-pump capacitor $C_{L\_OFF}$ decreases from a voltage of nearly 15V to approximately 7.5V, as shown in the waveform 430a. The negative gate-to-source voltage Vgs is maintained through the remainder of the turn-off phase.

The waveforms 410b, 420b, 430b of FIG. 4B are similar to those of FIG. 4A, except that the charge-pump capacitor $C_{L\_OFF}$ is fully discharged at the end of the Miller plateau, as described in the third scenario above. The smaller charge-pump capacitor $C_{L\_OFF}$ leads to its faster and complete discharge. As shown in waveform 430b, the voltage across the charge-pump capacitor $C_{L\_OFF}$ decreases from a voltage of nearly 15V to approximately 0V between times t0 and t2. As shown in the waveforms 410b, the decrease of the gate-to-source voltage Vgs pauses between times t1 and t2 at the Miller plateau. At time t2, the gate-to-source voltage Vgs drops below the threshold voltage of the power switch 110 and the power switch stops conducting. The driver output voltage and the gate-to-source voltage Vgs subsequently equalize to an equilibrium voltage of $V_{EQ}$=0V at time t3. The turn-off of the power switch 110 takes longer under the third scenario illustrated in the waveforms of FIG. 4B, but the resultant gate-to-source voltage Vgs of 0V speeds the subsequent turn-on transition.

Turn-On Charge Pump

The turn-on charge pump 140 includes a capacitor $C_{L\_ON}$, a reference-setting switch QL1, a charging switch QL2, and a charging diode D4. The switch QL1 is controlled by the direct drive signal PONL, such that the switch QL1 conducts simultaneously with the turn-on driver switch QL_ON. The switch QL2 is driven by the inverted drive signal POFFL, such that switch QL2 conducts simultaneously with the turn-off driver switch QL_OFF. The power loops (current flows) of FIGS. 2A and 2B were previously described in the context of operation of the turn-off charge pump 130. Below, the power loops of FIGS. 2A and 2B are used in describing operation of the turn-on charge pump 140.

FIG. 2B illustrates power loops for the "OFF" phase of the power switch 110, during which the gate of the power switch 110 is discharged. Also during the "OFF" phase, the capacitor $C_{L\_ON}$ is charged from the positive voltage rail VDC_L. In particular, the switch QL2 couples the negative terminal of the capacitor $C_{L\_ON}$ to a reference voltage, e.g., ground, while the diode D4 supplies current to and charges the positive terminal of the capacitor $C_{L\_ON}$. At the end of the "OFF" phase, the capacitor $C_{L\_ON}$ is charged with a voltage $V_{C\_ON}$=VDC_L-$V_F$, where $V_F$ is the forward voltage drop of the diode D4, e.g., 0.7V.

At the end of the "OFF" phase, the direct drive signal PONL turns on the turn-on switch QL_ON and the switch QL1, whereas the switch QL2 is turned off by the inverted signal POFFL. FIG. 2A shows the resultant power loop at the beginning of an "ON" phase, wherein current flows to the gate (G) of the power switch 110 from the driver circuit 120 via the driver output 122. The switch QL1 couples the negative terminal of the capacitor $C_{L\_ON}$ to the positive voltage rail VDC_L. The high voltage $V_{ON}$ transitions to VDC_L+$V_{C\_ON}$=VDC_L+(VDC_L-$V_F$), which is higher than the voltage VDC_L that would otherwise be provided to the gate (G) of the power switch 110, thereby enabling a high level of source (charging) current.

Figure 2D:
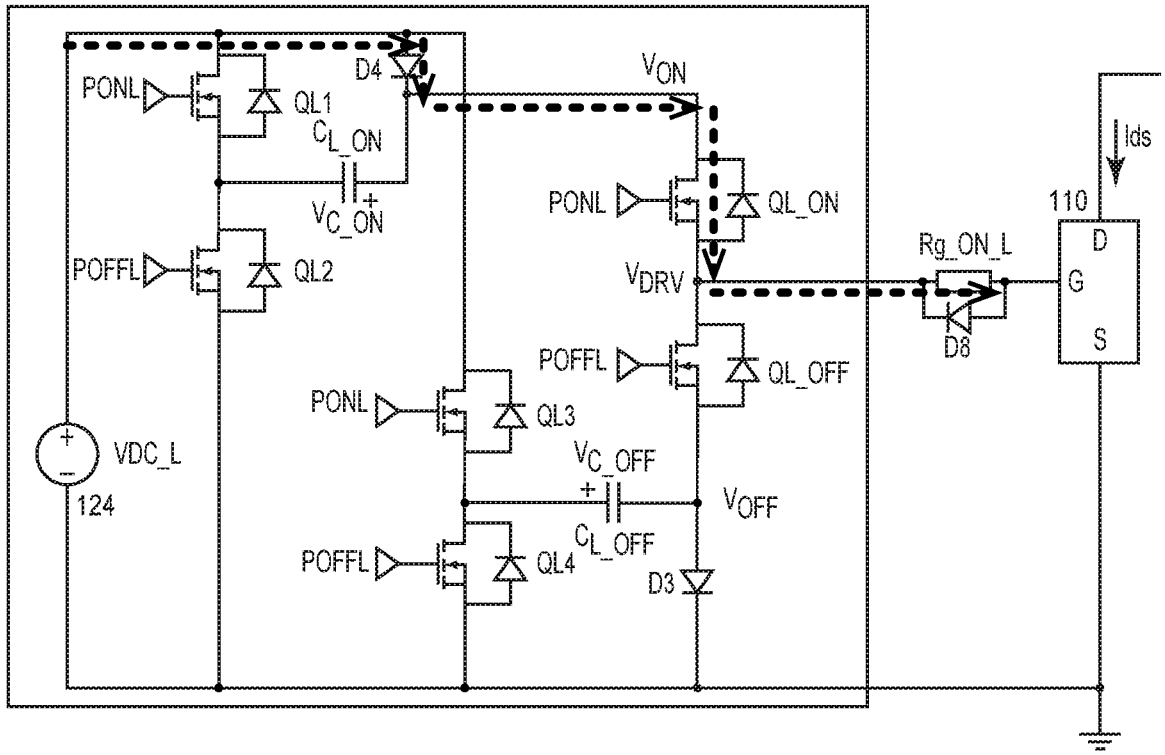

If the charge transferred to the power switch gate (G) exceeds the charge stored on the capacitor $C_{L\_ON}$, the voltage $V_{C\_ON}$ across the capacitor $C_{L\_ON}$ will decrease to zero and the high voltage $V_{ON}$ will decrease to VDC_L or just below VDC_L. The diode D4 will become forward biased and prevent the high voltage $V_{ON}$ from falling below VDC_L-$V_F$. FIG. 2D illustrates a power loop corresponding to such a scenario, as may occur towards the end of an on-phase. For this power loop, the high voltage $V_{ON}$ has decreased to VDC_L-$V_F$, such that the diode D4 conducts. The diode D4 clamps the high voltage $V_{ON}$ such that it cannot fall below VDC_L-$V_F$.

Figure 5A:
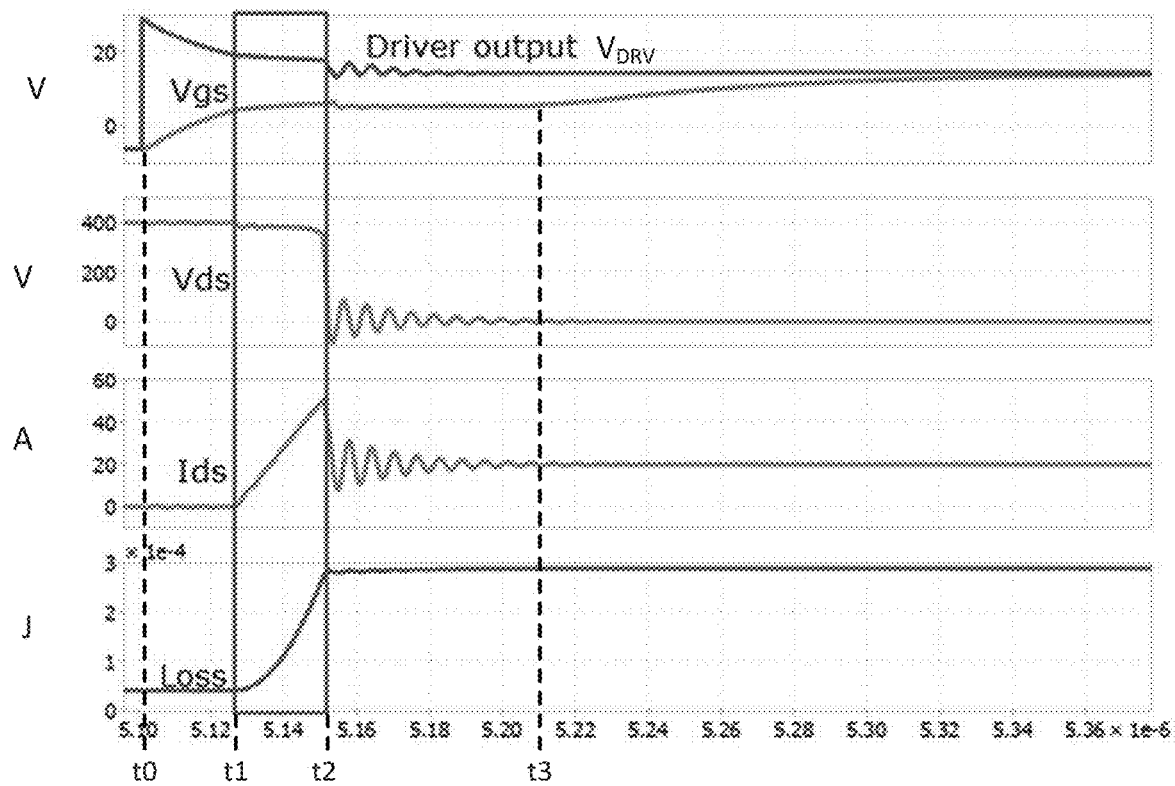
Figure 5B:
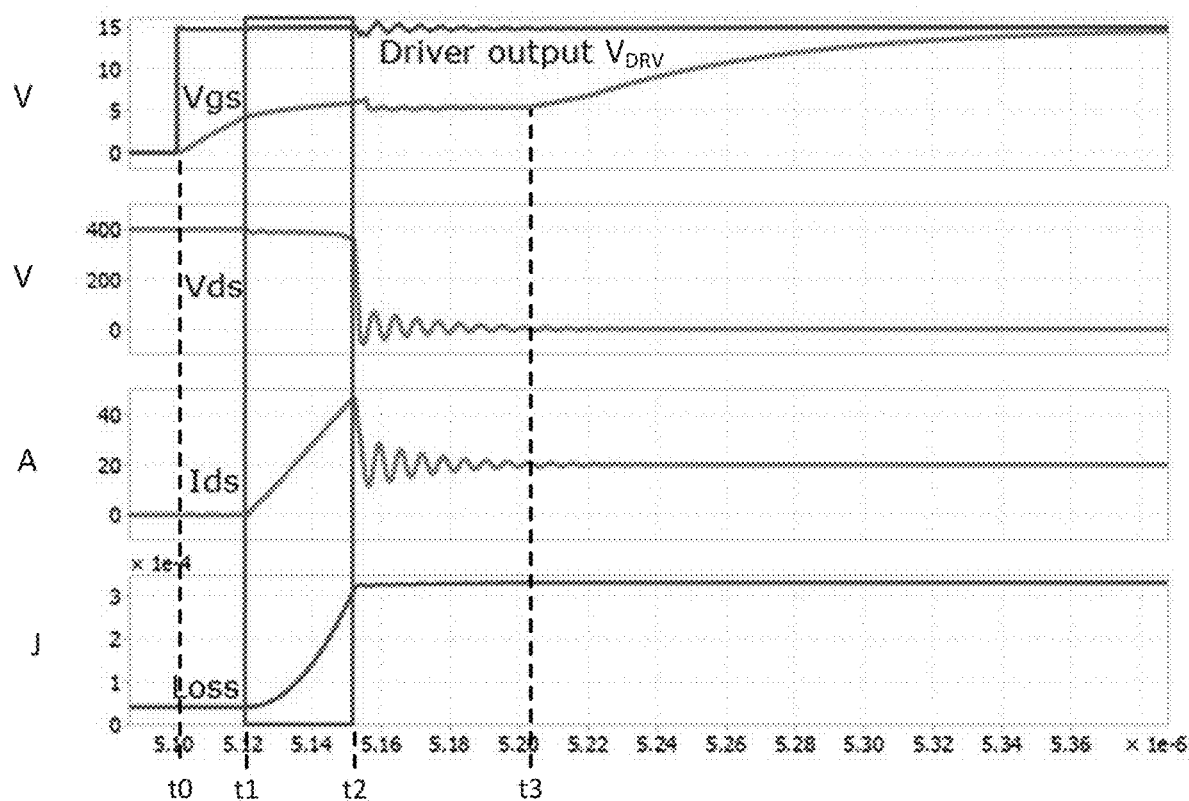

FIG. 5A illustrates waveforms corresponding to turn-on timing for a switch driver using a turn-on charge pump such as the turn-on charge pump 140 of FIG. 1, whereas FIG. 5B illustrates waveforms corresponding to turn-on timing when such a turn-on charge pump is not used. The waveforms of these figures show that the turn-on charge pump provides faster turn-on transitions and lower power loss in the power switch 110.

FIG. 5A illustrates waveforms corresponding to the driver output voltage $V_{DRV}$, the gate-to-source voltage Vgs of the power switch 110, the drain-to-source voltage Vds of the power switch 110, the current Ids of the power switch 110, and the integrated Loss of the power switch 110. (The 'Loss' shown in FIGS. 5A and 5B is different from that of FIGS. 3A and 3B, in that FIGS. 5A and 5B show integrated/total energy loss whereas FIGS. 3A and 3B show instantaneous energy loss.) At time t0, the digital control signal PWM_L (not shown for ease of illustration) goes high, thereby turning on the turn-on driver switch QL_ON. The charge-pump switch QL2 is turned off, and the charge-pump switch QL1 is turned on, such that the turn-on charge pump 140 drives a boosted voltage onto the high-voltage node $V_{ON}$. The driver output 122 thus increases from a low voltage, e.g., −7.5V, to a $V_{ON}$ voltage of 2*VDC_L-$V_F$, e.g., 29.3V, at time t0. (The illustrated low voltage presumes a turn-off charge pump left the voltage at −7.5V at the end of a turn-off phase. It should be understood that the low voltage at time t0 could begin at some other value, e.g., 0V, if there is no turn-off charge pump or if the turn-off charge pump is configured such that its capacitor fully discharges.)

After time t0, the gate-to-source voltage Vgs of the power switch 110 begins to increase as current flows (charge transfers) to the power switch gate (G) from the driver output 122. This increase continues, but the power switch 110 remains off, until time t1. At time t1, the gate-to-source voltage Vgs crosses the threshold voltage Vth for the power switch 110, and current Ids begins flowing through the power switch 110. This current increases until time t2. During the period from t1 to t2, the voltage Vds of the power switch 110 maintains a high value, and the gate-to-source voltage Vgs of the power switch 110 increases to the Miller voltage, which corresponds to the current Ids flowing through the power switch 110. After time t2, the voltage Vds of the power switch 110 collapses to approximately 0V. The gate-to-source voltage Vgs stays constant until time t3, at which point all gate capacitances, including the gate-to-source and the gate-to-drain capacitances, are charged. With these capacitances charged, the continued current flow from the driver output 122 causes the gate-to-source voltage Vgs to increase until it matches the driver output voltage $V_{DRV}$.

The waveforms of FIG. 5B are similar to those of FIG. 5A. However, the driver output 122 only provides a voltage level of VDC_L at time t0, rather than the boosted voltage illustrated in FIG. 5A for the case when a turn-on charge pump is employed. Due to this lower voltage, the power switch gate (G) takes longer to charge and the gate-to-source voltage Vgs takes longer to increase. This is seen in the increased interval between times t1 and t2, as compared with the corresponding interval in FIG. 5A. The increased interval, in turn, means that nonzero Vds and Ids have a longer overlap interval, during which switch loss is accumulated. As a result of this, the waveforms of FIG. 5B show that the Loss of the power switch 110 is greater than for the circuit corresponding to FIG. 5A. More particularly, the accumulated energy Loss shown in FIG. 5A is just under 30 mJ, whereas the corresponding Loss shown in FIG. 5B is approximately 33 mJ.

Capacitance Selection for the Turn-On Charge Pump

The waveforms of FIG. 5A show that the driver output voltage $V_{DRV}$ and the gate-to-source voltage Vgs of the power switch 110 migrate towards an equilibrium voltage that is approximately equal to the positive voltage rail VDC_L, thereby indicating that the capacitor $C_{L\_ON}$ is discharged. However, the equilibrium voltage does not fall below (VDC_L-$V_F$), such that the diode D4 is forward biased. Hence, for the illustrated scenario of FIG. 5A, the power loop of FIG. 2D, wherein the diode D4 provides additional current (charge) to the power switch gate (G), does not occur.

The equilibrium voltage of the turn-on phase depends upon the capacitance of the capacitor $C_{L\_ON}$ within the turn-on charge pump 140. A large capacitance leads to a scenario in which the capacitor $C_{L\_ON}$ is not fully discharged, and the equilibrium voltage remains higher than the positive voltage rail VDC_L throughout the turn-on phase. Conversely, a small capacitance leads to a scenario in which the capacitor $C_{L\_ON}$ is completely discharged during the turn-on interval and the voltage $V_{ON}$ decreases to a value $V_{ON}$=VDCL-$V_F$, such that the diode D4 becomes forward biased and the driving voltage $V_{DRV}$ is clamped VDCL-$V_F$. If the capacitor $C_{L\_ON}$ is completely discharged during a turn-on phase, additional charge may be provided to the power switch gate (G) from the power supply 124 via the diode D4.

As described previously, the power switch 110 has a gate-to-source capacitance as well as other external gate capacitances, which are considered herein to be a merged gate-to-source capacitance Cgs. With the charge-pump switch QL1 and the turn-on driver switch QL_ON set to conduct, the gate-to-source capacitance Cgs and charge pump capacitance $C_{L\_ON}$ are connected in parallel, such that the charge on them will balance until a voltage equilibrium is achieved, presuming the diode D4 is not forward biased during the turn-on phase. (The ohmic losses of the charge pump switches QL1, QL2 and the driver switches QL_ON, QL_OFF are typically negligible, and are not considered in the following explanations.)

At the end of the turn-off phase of the power switch 110, the gate-to-source capacitance Cgs has a charge of Cgs*$V_0$, wherein $V_0$ is the gate-to-source voltage Vgs at the end of the turn-off phase, e.g., the turn-off equilibrium voltage $V_{EQ}$ described previously. This initial voltage $V_0$ at the start of the turn-on phase is typically 0V or some negative voltage. The charge on the capacitance Cgs is Cgs*$V_{EQ\_ON}$ at the end of the turn-on phase, once the driver voltage $V_{DRV}$ and the gate voltage Vgs have settled to an equilibrium voltage $V_{EQ\_ON}$. Hence, the charge accumulated on the gate-to-source capacitance Cgs during the turn-on phase is given by $Q_{GS\_CHG}$=Cgs($V_{EQ\_ON}$-$V_0$).

During the turn-on phase, the voltage $V_{C\_ON}$ across the charge pump capacitor $C_{L\_ON}$ decreases from VDCL-$V_F$ to $V_{EQ\_ON}$, presuming the capacitor $C_{L\_ON}$ is not fully discharged such that the diode D4 becomes forward biased. Hence, the charge transferred from the capacitor $C_{L\_ON}$ during the turn-on phase is given by $Q_{CON\_DIS}$=$C_{L\_ON}$*(VDC_L-$V_F$)-$C_{L\_ON}$*$V_{EQ\_ON}$.

The charge transferred from the turn-on capacitor $C_{L\_ON}$ should be the same as the charge accumulated on the gate-to-source capacitance Cgs, as given by:

$$Cgs*(V_{EQ\_ON} - V_0) = C_{L_{ON}} *(VDC_L - Vf) - C_{L_{ON}} * V_{EQ\_ON}, \quad (17)$$

$$V_{EQ\_ON} = \frac{C_{L_{ON}} *(VDC_L - Vf) + Cgs * V_0}{C_{L_{ON}} + Cgs}. \quad (18)$$

To prevent a full discharge of the capacitor $C_{L\_ON}$, its capacitance should be chosen such that the final equilibrium voltage $V_{EQ\_ON}$ at the end of the turn-on phase remains at or above VDC_L. Using equation (17), the minimum capacitance $C_{L\_ON}$ to achieve this is given by:

$$Cgs*(VDC_L - V_0) = C_{L_{ON}} *(VDC_L - Vf), \quad (19)$$

$$C_{L_{ON}} = \frac{Cgs*(VDC_L - V_0)}{(VDC_L - Vf)}. \quad (20)$$

The above description neglects charge provided at the drain of the power switch 110 during the turn-on transition as the drain-to-source voltage Vds collapses to zero, e.g., at time t2 in FIG. 5A. The gate-to-drain capacitance Cgd appears in series with the paralleled capacitances Cgs and $C_{L\_ON}$, and, thus, the charge injected on the drain-to-source capacitance Cgd will be injected to the parallel equivalent capacitance Cgs+$C_{L\_ON}$ as follows:

$$Cgd*(Vbus + VDC_L + V_0) = \Delta V_{miller} *(C_{L_{ON}} + Cgs) \quad (21)$$

$$\Delta V_{miller} = \frac{Cgd*(Vbus + VDC_L + V_0)}{C_{L_{ON}} + Cgs} \quad (22)$$

The final voltage at the gate depends on both the equilibrium voltage, as described in equation (18), and the Miller voltage, as described in equation (22), as follows:

$$Vgs = V_{EQ\_ON} + V_0 - \Delta V_{miller} = \frac{C_{L_{ON}} *(VDC_L - Vf) + Cgs*V_0}{C_{L_{ON}} + Cgs} + \quad (23)$$

-continued
$$V_0 - \frac{Cgd*(Vbus+VDC_L+V_0)}{C_{L_{ON}}+Cgs}$$

As alluded to previously, the charge pump capacitance $C_{L\_ON}$ may be selected to achieve different circuit behaviors. In a first scenario, the capacitance $C_{L\_ON}$ is selected to be large enough that it is not fully discharged during the turn-off phase, such that the gate voltage remains higher than the positive voltage rail VDC_L throughout the turn-on phase of the power switch 110. This capacitance may be determined as follows:

$$V_{EQ\_ON} > (VDC_L + (V_0 - \Delta V_{miller})), \quad (24)$$

$$Vgs > VDC_L, \quad (25)$$

$$C_{L_{ON}} > \frac{Cgd*V_0 + Cgd*Vbus + Cgd*VDC_L - Cgs*VDC_L}{V_0 - Vf} \quad (26)$$

In a second scenario, the on-to-off transition of the power switch 110 is shortened by discharging the charge pump capacitor $C_{L\_ON}$ by the end of the turn-on phase, such that the gate-to-source voltage Vgs=VDC_L for the power switch 110 at the end of the transition. The capacitance for this scenario may be determined as follows:

$$Vgs = VDC_L, \quad (27)$$

$$C_{L_{ON}} = \frac{Cgd*V_0 + Cgd*Vbus + Cgd*VDC_L - Cgs*VDC_L}{V_0 - Vf} \quad (28)$$

In a third scenario, the dI/dt stage of the power switch 110 is sped up by determining a charge pump capacitance $C_{L\_ON}$ such that this capacitor is fully discharged at the end of the start of the Miller plateau. Such a capacitance is determined as follows:

$$Cgs*(Vmiller - V_0) = C_{L_{ON}}*(VDC_L - Vf), \quad (29)$$

$$C_{L_{ON}} = \frac{Cgs*(Vmiller - V_0)}{VDC_L - Vf}. \quad (30)$$

Figure 6A:
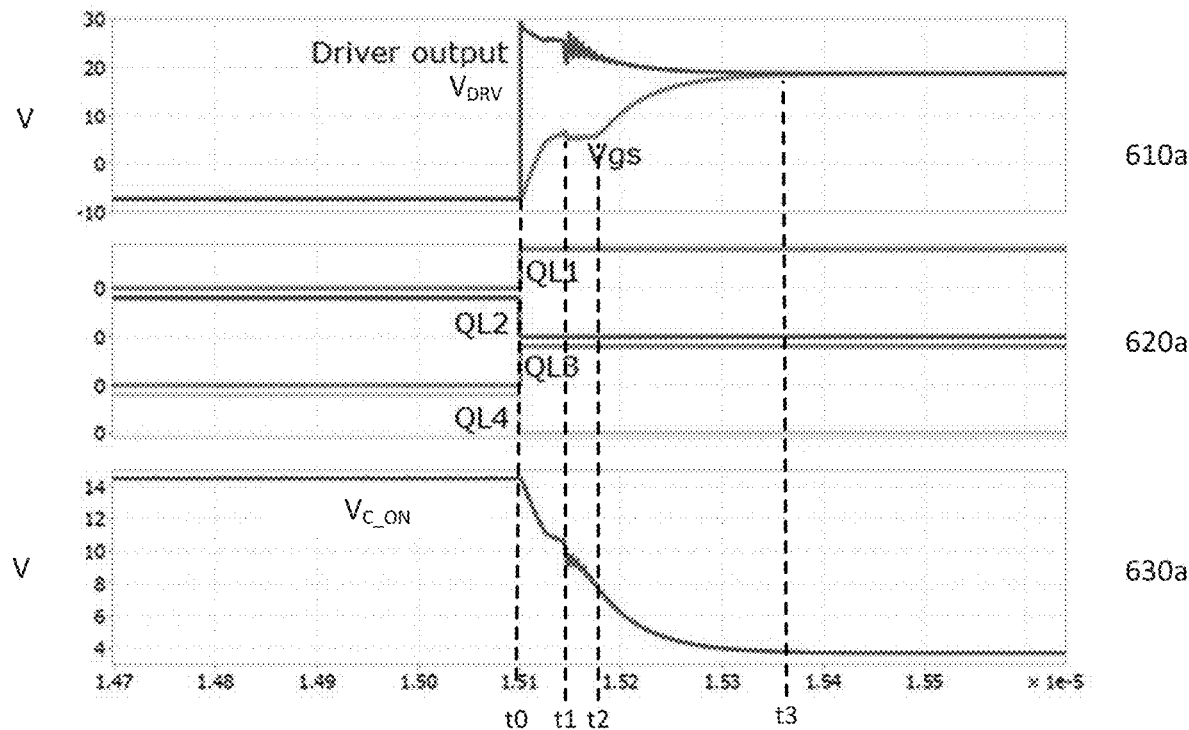
FIGS. 6A and 6B illustrate voltage waveforms corresponding to the driver circuit of FIG. 1 for different values of a turn-on charge pump capacitor within the driver circuit.
Figure 6B:
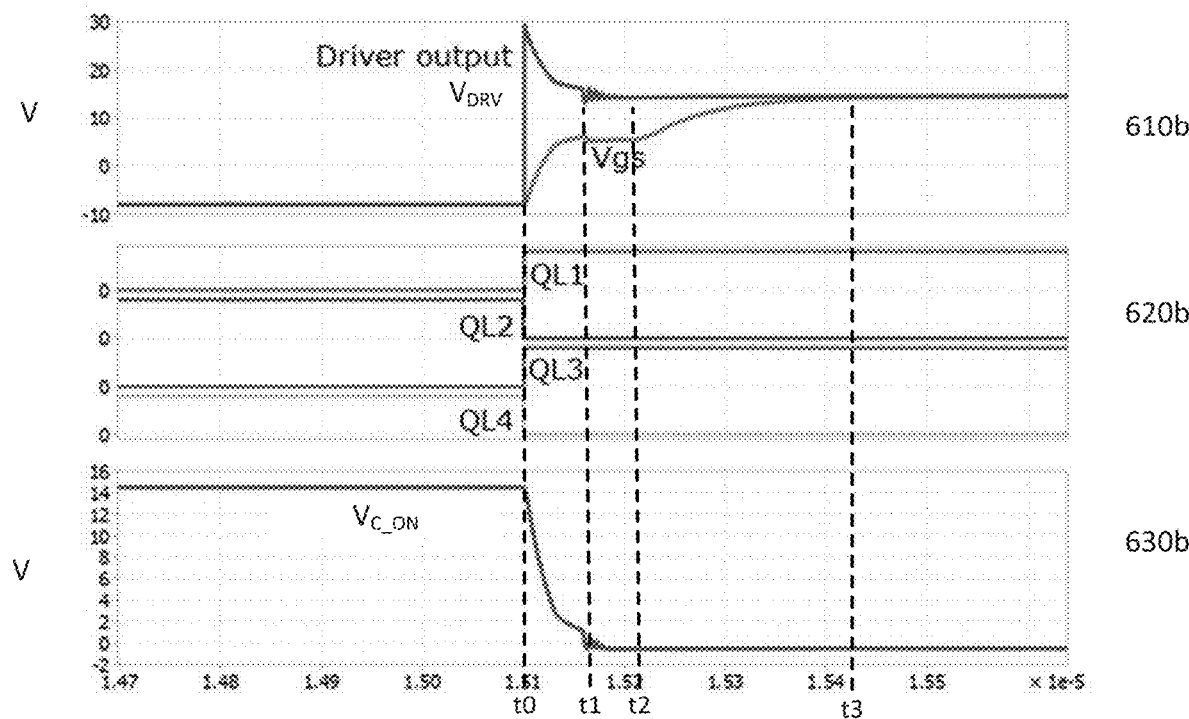

FIGS. 6A and 6B illustrate, respectively, waveforms corresponding to the first and third scenarios described above. As shown in FIG. 6A, at time t0, a control signal transitions so as to instigate a turn on of the power switch 110. This is shown in waveforms 620a, wherein the charge-pump switch QL2 is turned off and the charge-pump switch QL1 is turned on at time t0. The driver output transitions from a low voltage, e.g., −7.5V, to a boosted voltage that is nearly double the positive voltage rail, e.g., 2*VDC_L−$V_F$=29.3V, as shown in the waveforms 610a. Between times t0 and t3, charge is transferred to the gate (G) of the power switch 110 from the charge-pump capacitor $C_{L\_ON}$, such that the gate-to-source voltage Vgs and the driver output voltage $V_{DRV}$ converge to an equilibrium voltage $V_{EQ\_ON}$ of about 19V. The voltage $V_{C\_ON}$ across charge-pump capacitor $C_{L\_ON}$ decreases from a voltage of nearly 15V to approximately 4V, as shown in the waveform 630a. At time t1, the increase of the gate-to-source voltage Vgs pauses at the Miller plateau. Between times t1 and t2, the voltage Vgs remains relatively constant as the gate-to-drain capacitance is charged. After this capacitance is charged at time t2, the power switch 110 is fully turned on and the gate-to-source voltage Vgs continues to rise until it equalizes with the driver output voltage $V_{DRV}$.

The waveforms 610b, 620b, 630b of FIG. 6B are similar to those of FIG. 6A, except that the charge-pump capacitor $C_{L\_ON}$ is fully discharged at the start of the Miller plateau, as described in the third scenario above. The smaller charge-pump capacitor $C_{L\_ON}$ leads to its faster and complete discharge. As shown in waveform 630b, the voltage across the charge-pump capacitor $C_{L\_ON}$ decreases from a voltage of nearly 15V to approximately 0V between times t0 and t1. As shown in the waveforms 610b, the increase of the gate-to-source voltage Vgs pauses between times t1 and t2 at the Miller plateau. At time t2, the Miller capacitance is fully charged and the gate-to-source voltage Vgs begins a second increase, which continues until this voltage Vgs and the driver output voltage $V_{DRV}$ reach an equilibrium. The turn on of the power switch 110 takes longer under the third scenario illustrated in the waveforms of FIG. 6B, but the resultant gate-to-source voltage Vgs of about VDCL, rather than a voltage higher than VDCL, speeds the subsequent turn-off transition.

Turn-Off Charge Pump within a Bootstrapped High-Side Driver

Figure 7:
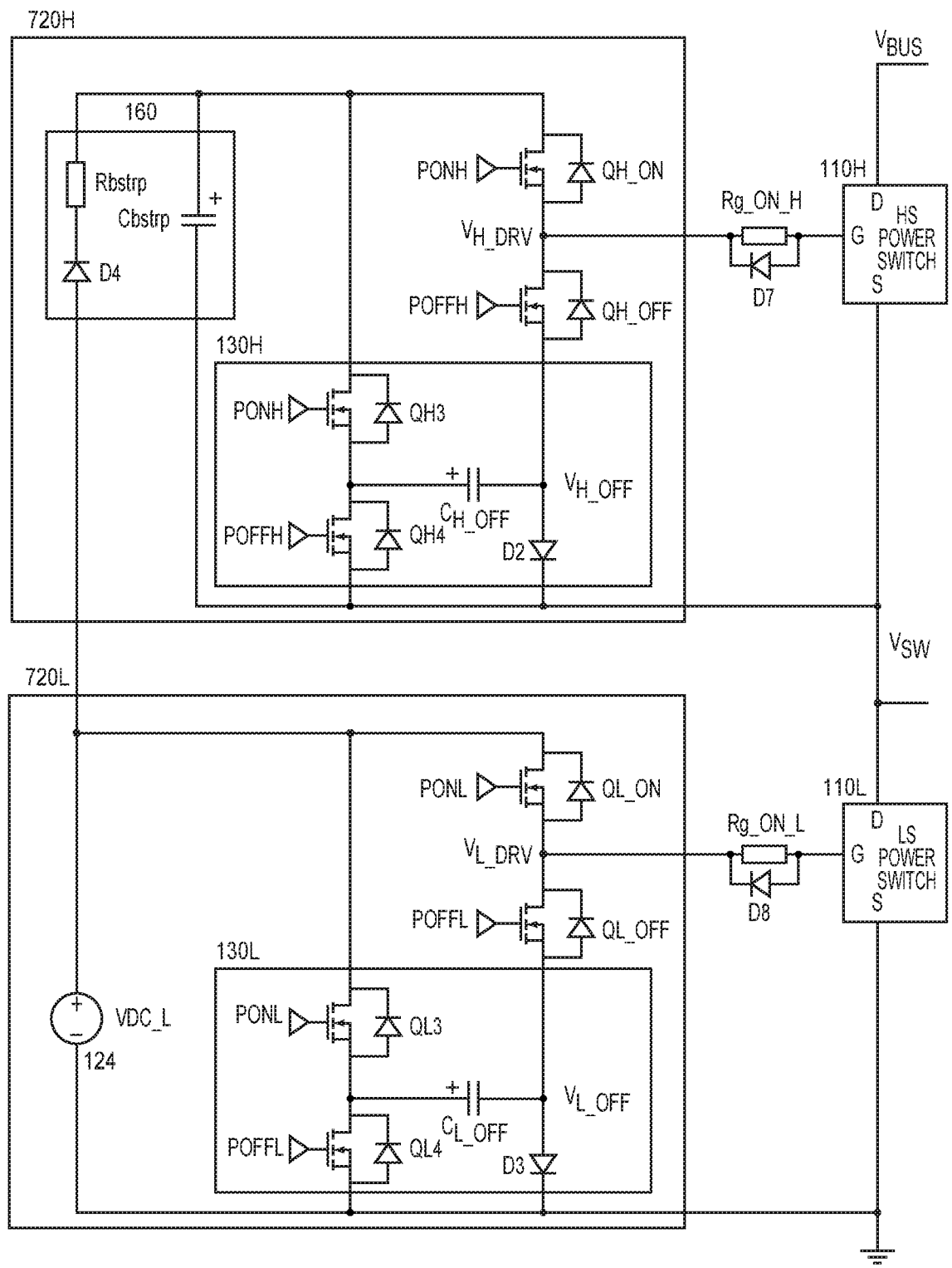
FIG. 7 illustrates high and low-side driver circuits used for driving high and low-side power switches of a half-bridge, wherein the high-side driver circuit is powered by a bootstrap capacitor and diode.

The circuits described above only include one power switch 110 and one driver circuit 120. FIG. 7 illustrates driver circuits 720H, 720L configured to drive a half bridge. The half-bridge includes a high and low-side power switch 110H, 110L, which are connected at a switching node $V_{SW}$. The switching node $V_{SW}$ may, for example, provide an alternating current (AC) voltage supplied to an inductor of a switching voltage converter. For ease of explanation, the driver circuits 720H, 720L only include turn-off charge pumps 130H, 130L, but it should be understood that turn-on charge pumps could be also be included in the same manner as described previously.

The high-side driver circuit 720H is powered from a bootstrap circuit 160. The bootstrap circuit 160 includes a bootstrap capacitor Cbstrp and a bootstrap diode D4. The driver supply 124 charges the bootstrap capacitor Cbstrp via the diode D4 when the switching node $V_{SW}$ is at ground potential. For example, when the low-side power switch 110L is turned on (QL_ON is conducting), the switching node $V_{SW}$ is coupled to ground and the bootstrap capacitor is charged from the diode D4 and bootstrap resistor Rbstrp. (The bootstrap resistor Rbstrp serves to limit the current flow and may be omitted in some circuits.) The voltage across the bootstrap capacitor Cbstrp is lower than VDC_L by the forward voltage drop $V_F$ of the diode D4. Otherwise, the high-side driver circuit 720H behaves in much the same manner as the previously-described driver circuit 120. When the low-side power switch 110L is turned off, the switching node $V_{SW}$ is decoupled from ground. The diode D4 blocks reverse current so that the bootstrap capacitor Cbstrp can maintain the high-side positive voltage VDC_L−$V_F$ that was charged thereupon, relative to the voltage at the switch node $V_{SW}$. This high-side positive voltage may then be used to source current for the turn on of the high-side power switch 110H and for the charging of the turn-off charge pump capacitor $C_{H\_OFF}$.

Biasing of Driver Output Stage

Figure 8A:
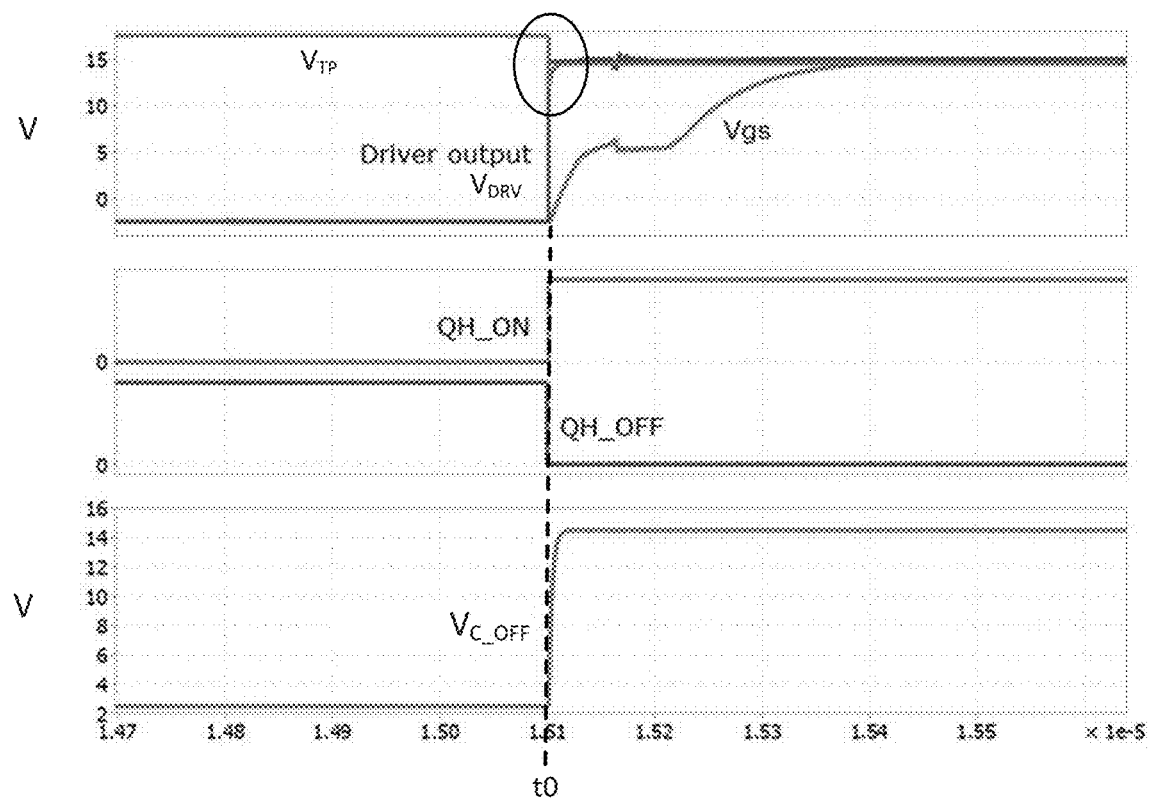
FIGS. 8A and 8B illustrate waveforms showing voltage transients across the output stage of a driver circuit.
Figure 8B:
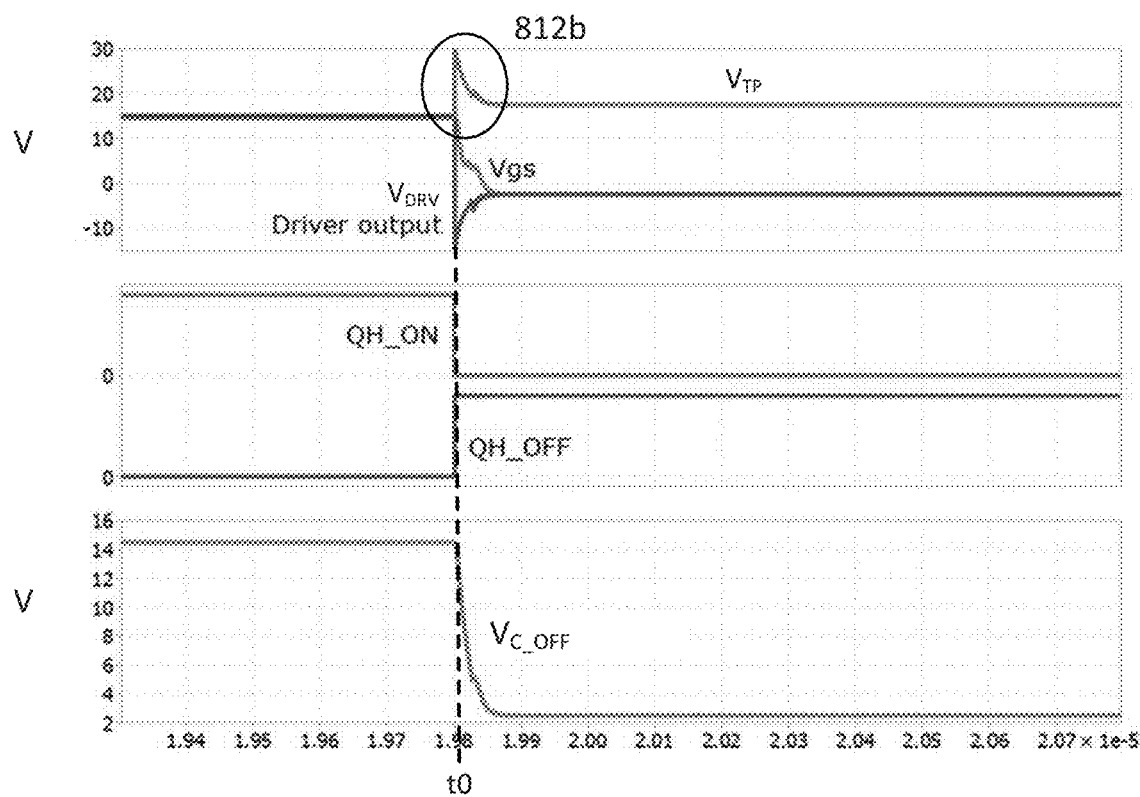

The voltage between the rails of the totem-pole output stage are subject to undesirable transients as the gate capacitance is charged and/or discharged. This voltage is given, e.g., by the difference between the high voltage $V_{ON}$ and the low voltage $V_{OFF}$, as shown in FIG. 1, and is henceforth termed the totem-pole output-stage voltage $V_{TP}$. FIG. 8A shows a transient 812a in the output-stage voltage $V_{TP}$ when driver circuit 120 begins to turn on the power switch 110. FIG. 8B shows a transient 812b in the output-stage voltage $V_{TP}$ when the driver circuit 120 begins to turn off the power switch 110.

Figure 9:
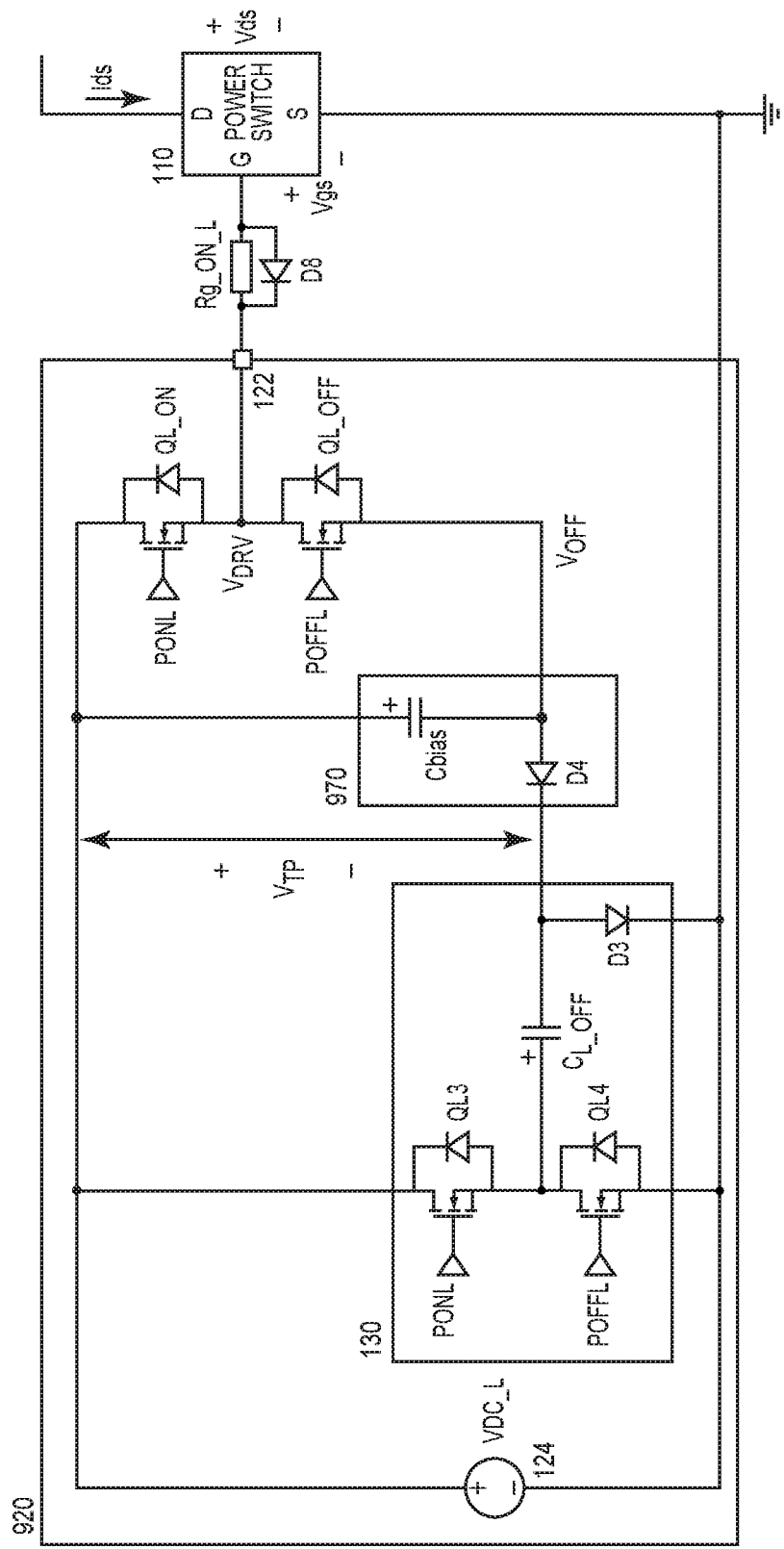
FIG. 9 illustrates a driver circuit including a bias capacitor and diode configured to stabilize the voltage across the output stage of the driver circuit.
Figure 10A:
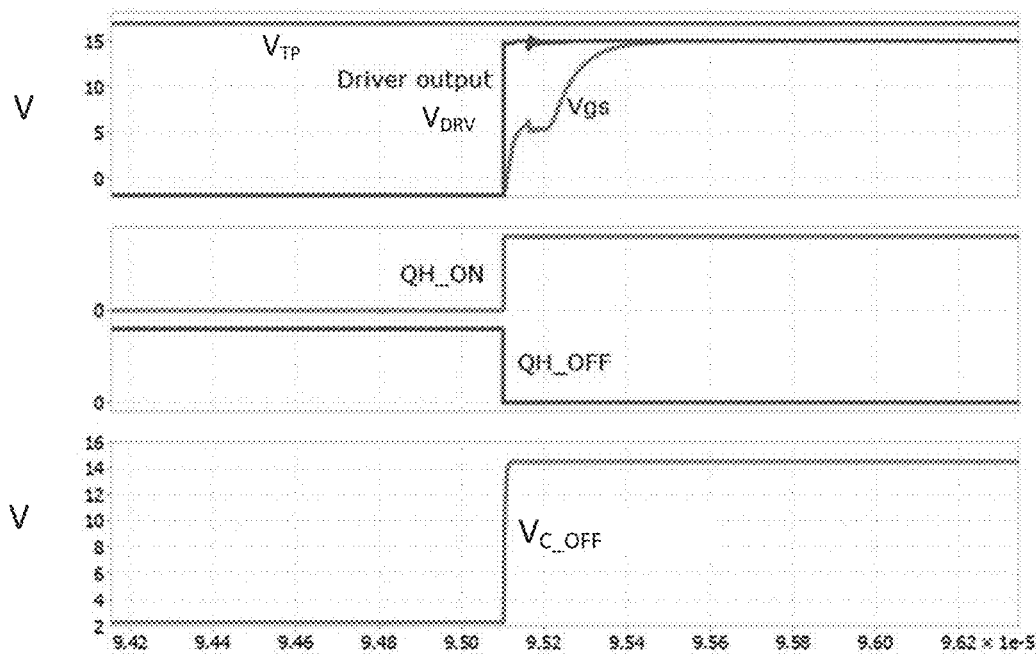
FIGS. 10A and 10B illustrate waveforms corresponding to voltages within the driver circuit of FIG. 9.
Figure 10B:
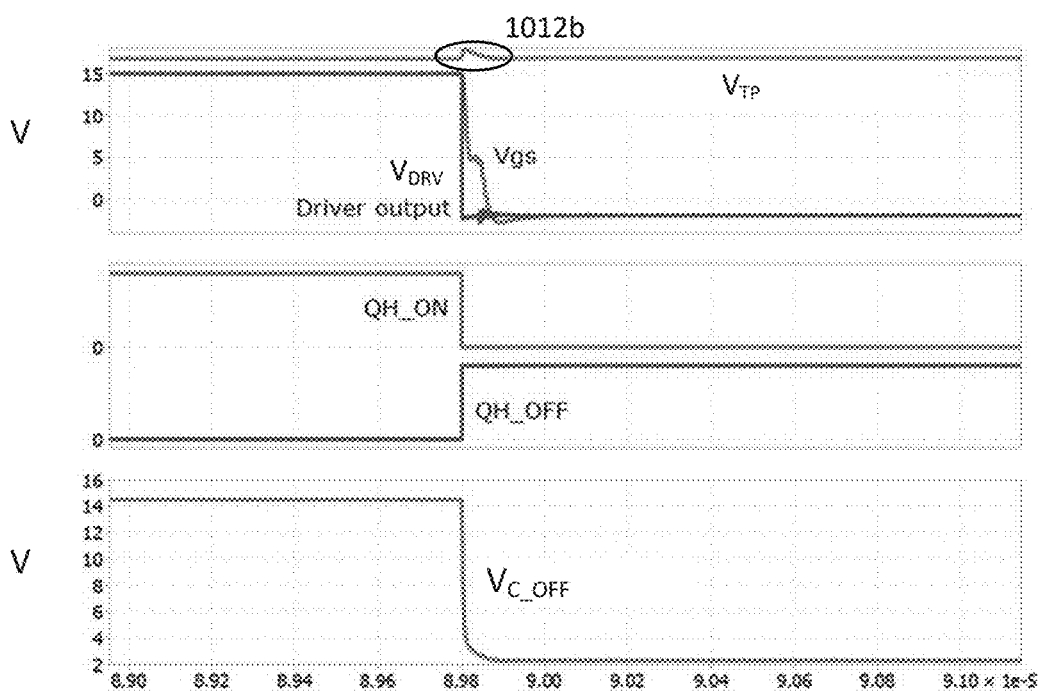

FIG. 9 illustrates a driver circuit 920 that has a turn-off charge pump 130 similar to that of FIG. 1. In addition, the driver circuit 920 includes a biasing capacitor Cbias coupled across the output stage, i.e., between $V_{ON}$ and $V_{OFF}$. A diode D4 isolates the output stage and biasing capacitor Cbias from the turn-off charge pump 130, and prevents the charge pump 130 from undesirably raising the low voltage $V_{OFF}$. The capacitor Cbias and diode D4, which together comprise a biasing circuit 970, serve to stabilize the voltage provided across $V_{ON}$ and $V_{OFF}$, thereby reducing voltage transients and improving the performance of the output stage. This is illustrated in FIGS. 10A and 10B, which show waveforms corresponding to the turn on and turn off of a power switch when using the driver circuit 920 of FIG. 9. The transient 812a shown in FIG. 8A is eliminated, whereas the transient 1012b of the output stage voltage $V_{TP}$ at an on-to-off transition is significantly attenuated. As shown, the output stage voltage $V_{TP}$ maintains a relatively stable voltage through both the on and off phases.

The components of the switched capacitor charge pump(s) may be integrated with the totem-pole output stage comprised of the turn-on and turn-off switches, or may be provided separately. For example, an integrated semiconductor die may include a turn-on and a turn-off switch. One such integrated die may be used for the totem-pole driver output stage, whereas a second such integrated die may be used for the switches of the turn-off charge pump. A capacitor and a diode that are external to the integrated dies may connect the dies and the power switch as described.

Although the present disclosure is not so limited, the following numbered examples demonstrate one or more aspects of the disclosure.

Example 1

A driver circuit comprises a first switch device, a second switch device, and a first switched capacitor charge pump. The first and second switch devices are coupled in series and connected at an output node of the driver circuit. The first switch device is configured to couple the output node to a high-voltage node during an on-phase of a switching cycle. The second switch device is configured to couple the output node to a low-voltage node during an off-phase of the switching cycle. The first switched capacitor charge pump is configured to apply a negative voltage to the low-voltage node during at least part of the off-phase of the switching cycle.

Example 2

The driver circuit of example 1, wherein the first switched capacitor charge pump is configured to apply a negative voltage to the low-voltage node during the entire off phase of the switching cycle.

Example 3

The driver circuit of example 1, wherein the first switched capacitor charge pump comprises a first diode, a first capacitor, and a first charging/discharging circuit. The first diode has an anode electrically connected to a source of the second switch device and a cathode electrically connected to a reference voltage rail. The first capacitor has a first terminal electrically connected between the anode of the first diode and the source of the second switch (the low-voltage node). The first charging/discharging circuit electrically connects to a second terminal of the first capacitor. The first charging/discharging circuit is configured to couple the second terminal of the first capacitor to a positive voltage rail while the second switch device is in an off state and the first switch device is in an on-state, and to couple the second terminal of the first capacitor to the reference voltage rail during at least part of the off-phase of the switching cycle.

Example 4

The driver circuit of example 3, wherein the first charging/discharging circuit comprises a third switch device coupled between the positive voltage rail and an output node of the first charging/discharging circuit, and a fourth switch device coupled between the reference voltage rail and the output node of the first charging/discharging circuit. The output node of the first charging/discharging circuit is electrically connected to the second terminal of the first capacitor. The first switch device and the third switch device are controlled by a same first signal, and the second switch device and the fourth switch device are controlled by a same second signal, which is complementary to the first signal.

Example 5

The driver circuit of example 3, wherein the first capacitor has a minimum capacitance (C1) of $$C1 = \frac{Cgs * VDC_L}{VDC_L - Vf},$$

where $V_{DCL}$ is the positive voltage rail, $C_{gs}$ is a gate-to-source capacitance of the power switch, and Vf is a forward voltage of the first diode.

Example 6

The driver circuit of example 3, wherein the first capacitor is configured to fully discharge before the end of the off phase of the switching cycle, and wherein the first diode couples the source of the second switch device to the reference voltage rail when the first capacitor is fully discharged.

Example 7

The driver circuit of example 6, wherein the first capacitor is configured to fully discharge after a gate-to-source voltage of the power switch decreases from a Miller voltage of the power switch to a threshold voltage of the power switch.

Example 8

The driver circuit of example 6, wherein the first capacitor is configured to fully discharge after a drain-to-source voltage of the power switch transitions from zero Volts to a bus voltage coupled to the drain of the power switch.

Example 9

The driver circuit of example 3, further comprising a biasing circuit including an additional capacitor electrically connected between the high-voltage node and the low-voltage node, and an additional diode having an anode electrically coupled to the low-voltage node and a cathode electrically coupled to the anode of the first diode.

Example 10

The driver circuit of example 1, further comprising a second switched capacitor charge pump configured to apply a boosted voltage to the high-voltage node during at least part of the on phase of the switching cycle, the boosted voltage being greater than a positive voltage rail provided by a driver power supply.

Example 11

The driver circuit of example 10, wherein the second switched capacitor charge pump is configured to apply the boosted voltage that is greater than the positive voltage rail until a drain-to-source current of the power switch reaches a peak value during the on phase of the switching cycle.

Example 12

The driver circuit of example 10, wherein the second switched capacitor charge pump comprises a second diode, a second capacitor, and a second charging/discharging circuit. The second diode has an anode electrically connected to the positive voltage rail and a cathode electrically connected to the high-voltage node. The second capacitor has a first terminal electrically connected to the high-voltage node between the cathode of the second diode and the drain of the first switch. The second charging/discharging circuit is configured to couple the second terminal of the second capacitor to a reference voltage rail while the first switch device is in an off state and the second switch device is in an on state, and to couple the second terminal of the second capacitor to the positive voltage rail during at least part of the on phase of the switching cycle.

Example 13

The driver circuit of example 12, wherein the second charging/discharging circuit comprises a fifth switch device coupled between the positive voltage rail and an output node of the second charging/discharging circuit, and a sixth switch device coupled between the voltage reference rail and the output node of the second charging/discharging circuit. The output node of the second switch circuit is electrically connected to the second terminal of the second capacitor. The first switch device and the fifth switch device are controlled by a same first signal, and the second switch device and the sixth switch device are controlled by a same second signal, which is complementary to the first signal.

Example 14

The driver circuit of example 12, wherein the second capacitor is configured to fully discharge before the end of the on phase of the switching cycle, and wherein the second diode couples a drain of the first switch device to the positive voltage rail when the second capacitor is fully discharged.

Example 15

The driver circuit of example 14, wherein the second capacitor is configured to be fully discharged at the end of the turn on phase when a gate-to-source voltage of the power switch increases to the positive voltage rail.

Example 16

The driver circuit of example 14, wherein the second capacitor is configured to fully discharge after a gate-to-source voltage of the power switch increases to a Miller voltage of the power switch.

Example 17

The driver circuit of example 1, wherein the output node of the driver circuit is electrically connected to a low-side power transistor, wherein a positive voltage rail of the driver circuit is electrically connected to a bootstrap capacitor of a bootstrap circuit for a high-side power transistor through a diode, and wherein the low-side power transistor and the high-side power transistor are coupled in a half bridge configuration.

Example 18

A driver circuit comprises a first switch device, a second switch device, and a switched capacitor charge pump. The first and second switch devices are coupled in series and connected at an output node of the driver circuit. The first switch device is configured to couple the output node to a high-voltage node during an on-phase of a switching cycle. The second switch device is configured to couple the output node to a low-voltage node during an off-phase of the switching cycle. The switched capacitor charge pump is configured to apply a boosted voltage to the high-voltage node during at least part of the on phase of the switching cycle. The boosted voltage is higher than a positive voltage rail that is provided to the switched capacitor charge pump by a driver power supply.

Example 19

The driver circuit of example 18, wherein the switched capacitor charge pump is configured to apply the boosted voltage that is higher than the positive voltage rail to the high-voltage node until a drain-to-source current of the power switch reaches a peak value during the on phase of the switching cycle.

Example 20

The driver circuit of example 18, wherein the switched capacitor charge pump comprises a diode, a capacitor, and a charging/discharging circuit. The diode has an anode electrically connected to the positive voltage rail and a cathode electrically connected to the high-voltage node. The capacitor has a first terminal electrically connected to the high-voltage node. The charging/discharging circuit is electrically connected to a second terminal of the capacitor, and is configured to couple the second terminal of the capacitor to a reference voltage rail while the first switch device is in an off state and the second switch device is in an on state, and to couple the second terminal of the capacitor to the positive voltage rail during at least part of the on phase of the switching cycle.

As used herein, the terms "having," "containing," "including," "comprising," and the like are open-ended terms that indicate the presence of stated elements or features, but do not preclude additional elements or features.

The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A driver circuit for driving a power switch, comprising:
a first switch device coupled in series to a second switch device at an output node of the driver circuit, the first switch device configured to couple the output node to a high-voltage node during an on phase of a switching cycle, the second switch device configured to couple the output node to a low-voltage node during an off phase of the switching cycle;
a first switched capacitor charge pump configured to apply a negative voltage to the low-voltage node during at least part of the off phase of the switching cycle; and
a second switched capacitor charge pump configured to apply a boosted voltage to the high-voltage node during at least part of the on phase of the switching cycle, the boosted voltage being greater than a positive voltage rail provided by a driver power supply,
wherein the second switched capacitor charge pump comprises:
a second diode having an anode electrically connected to the positive voltage rail and a cathode electrically connected to the high-voltage node;
a second capacitor having a first terminal electrically connected to the high-voltage node; and
a second charging/discharging circuit electrically connected to a second terminal of the second capacitor, the second charging/discharging circuit configured to couple the second terminal of the second capacitor to a reference voltage rail while the first switch device is in an off state and the second switch device is in an on state, and to couple the second terminal of the second capacitor to the positive voltage rail during at least part of the on phase of the switching cycle.

2. The driver circuit of claim 1, wherein the first switched capacitor charge pump is configured to apply a negative voltage to the low-voltage node during the entire off phase of the switching cycle.

3. The driver circuit of claim 1, wherein the first switched capacitor charge pump comprises:
a first diode having an anode electrically connected to a source of the second switch device and a cathode electrically connected to a reference voltage rail;
a first capacitor having a first terminal electrically connected between the anode of the first diode and the source of the second switch; and
a first charging/discharging circuit electrically connected to a second terminal of the first capacitor, the first charging/discharging circuit configured to couple the second terminal of the first capacitor to a positive voltage rail while the second switch device is in an off state and the first switch device is in an on state, and to couple the second terminal of the first capacitor to the reference voltage rail during at least part of the off phase of the switching cycle.

4. The driver circuit of claim 3, wherein the first charging/discharging circuit comprises a third switch device coupled between the positive voltage rail and an output node of the first charging/discharging circuit, and a fourth switch device coupled between the reference voltage rail and the output node of the first charging/discharging circuit, wherein the output node of the first charging/discharging circuit is electrically connected to the second terminal of the first capacitor, wherein the first switch device and the third switch device are controlled by a same first signal, and wherein the second switch device and the fourth switch device are controlled by a same second signal which is complementary to the first signal.

5. The driver circuit of claim 3, wherein the first capacitor has a minimum capacitance (C1) of $$C1 = \frac{Cgs * VDC_L}{VDC_L - Vf},$$

where $V_{DCL}$ is the positive voltage rail, $C_{gs}$ is a gate-to-source capacitance of the power switch, and Vf is a forward voltage of the first diode.

6. The driver circuit of claim 3, wherein the first capacitor is configured to fully discharge before the end of the off phase of the switching cycle, and wherein the first diode couples the source of the second switch device to the reference voltage rail when the first capacitor is fully discharged.

7. The driver circuit of claim 6, wherein the first capacitor is configured to fully discharge after a gate-to-source voltage of the power switch decreases from a Miller voltage of the power switch to a threshold voltage of the power switch.

8. The driver circuit of claim 6, wherein the first capacitor is configured to fully discharge after a drain-to-source voltage of the power switch transitions from zero Volts to a bus voltage coupled to the drain of the power switch.

9. The driver circuit of claim 3, further comprising a biasing circuit including an additional capacitor electrically connected between the high-voltage node and the low-voltage node, and an additional diode having an anode electrically coupled to the low-voltage node and a cathode electrically coupled to the anode of the first diode.

10. The driver circuit of claim 1, wherein the second switched capacitor charge pump is configured to apply the boosted voltage that is greater than the positive voltage rail until a drain-to-source current of the power switch reaches a peak value during the on phase of the switching cycle.

11. The driver circuit of claim 1, wherein the second charging/discharging circuit comprises a fifth switch device coupled between the positive voltage rail and an output node of the second charging/discharging circuit, and a sixth switch device coupled between the voltage reference rail and the output node of the second charging/discharging circuit, wherein the output node of the second switch circuit is electrically connected to the second terminal of the second capacitor, wherein the first switch device and the fifth switch device are controlled by a same first signal, and wherein the second switch device and the sixth switch device are controlled by a same second signal which is complementary to the first signal.

12. The driver circuit of claim 1, wherein the second capacitor is configured to fully discharge before the end of the on phase of the switching cycle, and wherein the second diode couples a drain of the first switch device to the positive voltage rail when the second capacitor is fully discharged.

13. The driver circuit of claim 12, wherein the second capacitor is configured to be fully discharged at the end of the turn on phase when a gate-to-source voltage of the power switch increases to the positive voltage rail.

14. The driver circuit of claim 12, wherein the second capacitor is configured to fully discharge after a gate-to-source voltage of the power switch increases to a Miller voltage of the power switch.

15. The driver circuit of claim 1, wherein the output node of the driver circuit is electrically connected to a low-side power transistor, wherein a positive voltage rail of the driver circuit is electrically connected to a bootstrap capacitor of a bootstrap circuit for a high-side power transistor through a diode and a resistor, and wherein the low-side power transistor and the high-side power transistor are coupled in a half bridge configuration.

16. A driver circuit for driving a power switch, comprising:
   a first switch device coupled in series to a second switch device at an output node of the driver circuit, the first switch device configured to couple the output node to a high-voltage node during an on phase of a switching cycle, the second switch device configured to couple the output node to a low-voltage node during an off phase of the switching cycle;
   a first switched capacitor charge pump configured to apply a negative voltage to the low-voltage node during at least part of the off phase of the switching cycle; and
   a biasing circuit,
   wherein the first switched capacitor charge pump comprises:
      a first diode having an anode electrically connected to a source of the second switch device and a cathode electrically connected to a reference voltage rail;
      a first capacitor having a first terminal electrically connected between the anode of the first diode and the source of the second switch; and
      a first charging/discharging circuit electrically connected to a second terminal of the first capacitor, the first charging/discharging circuit configured to couple the second terminal of the first capacitor to a positive voltage rail while the second switch device is in an off state and the first switch device is in an on state, and to couple the second terminal of the first capacitor to the reference voltage rail during at least part of the off-phase of the switching cycle,
   wherein the biasing circuit comprises:
      an additional capacitor electrically connected between the high-voltage node and the low-voltage node; and
      an additional diode having an anode electrically coupled to the low-voltage node and a cathode electrically coupled to the anode of the first diode.

17. A driver circuit for driving a power switch, comprising:
   a first switch device coupled in series to a second switch device at an output node of the driver circuit, the first switch device configured to couple the output node to a high-voltage node during an on phase of a switching cycle, the second switch device configured to couple the output node to a low-voltage node during an off phase of the switching cycle; and
   a first switched capacitor charge pump configured to apply a negative voltage to the low-voltage node during at least part of the off phase of the switching cycle,
   wherein the output node of the driver circuit is electrically connected to a low-side power transistor,
   wherein a positive voltage rail of the driver circuit is electrically connected to a bootstrap capacitor of a bootstrap circuit for a high-side power transistor through a diode and a resistor,
   wherein the low-side power transistor and the high-side power transistor are coupled in a half bridge configuration.

18. A driver circuit for driving a power switch, comprising:
   a first switch device coupled in series to a second switch device at an output node of the driver circuit, the first switch device configured to couple the output node to a high-voltage node during an on phase of a switching cycle, the second switch device configured to couple the output node to a low-voltage node during an off phase of the switching cycle; and
   a first switched capacitor charge pump configured to apply a negative voltage to the low-voltage node during at least part of the off phase of the switching cycle,
   wherein a capacitance of the first switched capacitor charge pump completely discharges during part of the off phase of the switching cycle.

* * * * *